United States Patent
Yoshino et al.

(10) Patent No.: US 8,169,780 B2
(45) Date of Patent: May 1, 2012

(54) POWER CONVERSION DEVICE

(75) Inventors: Tsutomu Yoshino, Wako (JP); Takeshi Kato, Wako (JP); Yoshihiko Higashidani, Wako (JP)

(73) Assignee: Honda Motor Co., Ltd., Tokyo (JP)

( * ) Notice: Subject to any disclaimer, the term of this patent is extended or adjusted under 35 U.S.C. 154(b) by 33 days.

(21) Appl. No.: 12/815,745

(22) Filed: Jun. 15, 2010

(65) Prior Publication Data
US 2010/0321889 A1    Dec. 23, 2010

(30) Foreign Application Priority Data

Jun. 18, 2009 (JP) ................................ 2009-145642
Jun. 18, 2009 (JP) ................................ 2009-145643
Jun. 18, 2009 (JP) ................................ 2009-145644

(51) Int. Cl.
H05K 7/20 (2006.01)
(52) U.S. Cl. ........ 361/699; 361/689; 361/704; 361/707; 165/80.4; 165/104.33
(58) Field of Classification Search .................... None
See application file for complete search history.

(56) References Cited

U.S. PATENT DOCUMENTS

| | | | | |
|---|---|---|---|---|
| 5,091,823 A * | 2/1992 | Kanbara et al. | ............... | 361/697 |
| 6,972,957 B2 * | 12/2005 | Beihoff et al. | ............... | 361/698 |
| 7,515,422 B2 * | 4/2009 | Hirota et al. | ............... | 361/709 |
| 7,710,721 B2 * | 5/2010 | Matsuo et al. | ............... | 361/699 |
| 7,952,856 B2 * | 5/2011 | Otsuka et al. | ............... | 361/624 |
| 7,978,468 B2 * | 7/2011 | Nakatsu et al. | ............... | 361/689 |
| 8,054,633 B2 * | 11/2011 | Suwa et al. | ............... | 361/728 |
| 8,064,198 B2 * | 11/2011 | Higashidani et al. | ..... | 361/679.53 |
| 2010/0326750 A1 * | 12/2010 | Murakami | ............... | 180/65.31 |

FOREIGN PATENT DOCUMENTS

JP     2005-073374     3/2005

* cited by examiner

*Primary Examiner* — Boris Chervinsky
(74) *Attorney, Agent, or Firm* — Squire Sanders (US) LLP

(57) ABSTRACT

In a power conversion device including: a converter which steps up or down a voltage of a direct current power supply; and an inverter which converts the direct current voltage obtained by the converter into an alternating voltage to drive an electric motor, a plurality of magnetic parts are arranged above a switching element assembly unit with a water-cooled type second heat sink interposed between the switching element assembly unit and the plurality of magnetic parts, the switching element assembly unit configured by mounting all the switching element modules on upper and lower surfaces of a water-cooled type first heat sink. Accordingly, it is possible to provide a power conversion device capable of housing many switching element modules in a compact space and cooling them effectively, while preventing the influence of a noise due to the magnetic parts from acting on the switching element modules as much as possible.

9 Claims, 21 Drawing Sheets

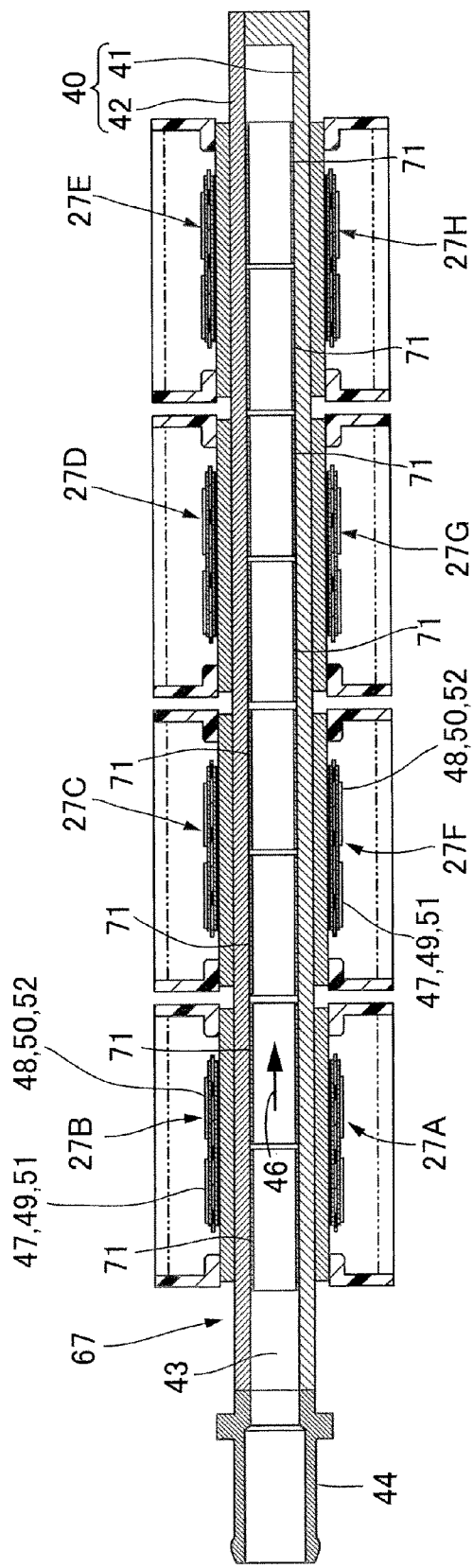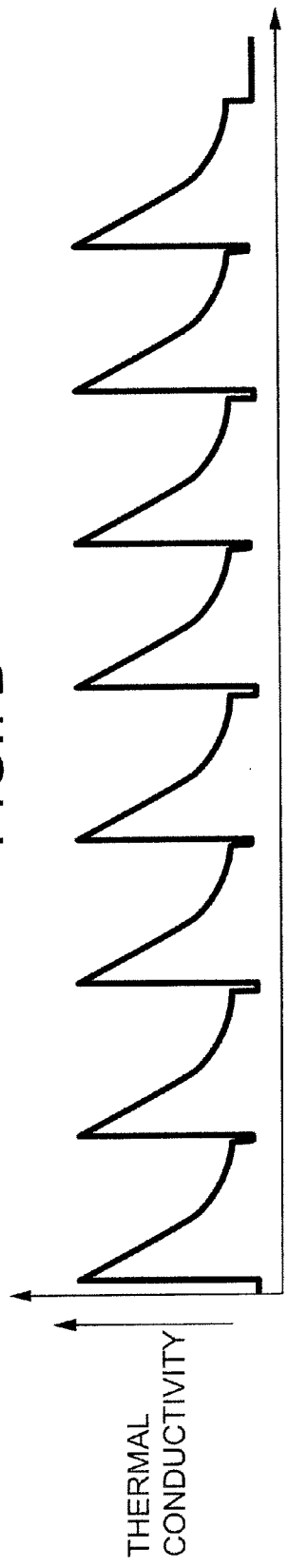

POWER CONVERSION DEVICE

CROSS-REFERENCE TO RELATED APPLICATIONS

The present application claims priority under 35 USC 119 to Japanese Patent Application Nos. 2009-145642, 2009-145643 and 2009-145644 filed on Jun. 18, 2009 the entire contents of which are hereby incorporated by reference.

BACKGROUND OF THE INVENTION

1. Field of the Invention

The present invention relates to a power conversion device comprising: a converter which includes a plurality of switching element modules and a plurality of magnetic parts, and steps up or down a voltage of a direct current power supply; and an inverter which includes a plurality of switching element modules other than the switching element modules of the converter and converts the direct current voltage obtained by the converter into an alternating voltage to drive an electric motor.

2. Description of the Related Art

Japanese Patent Application Laid-open No. 2005-73374 discloses a power conversion device in which a main circuit is configured by interposing multiple switching element modules between a pair of coolant tubes in a cooling system, and an inverter is configured by interposing the main circuit between a power wiring section including magnetic parts and a control circuit board having a control circuit to control the switching element modules.

Incidentally, the power conversion device disclosed by the above-mentioned Laid-open Publication is an inverter. In a power conversion device including a converter and an inverter, the converter and the inverter each include multiple switching element modules, and those many switching element modules need to be cooled. However, it is desirable to avoid an increase in the size of the structure for cooling many switching element modules. Also, the influence of a noise due to the magnetic parts included in the converter needs to be prevented from acting on the switching element modules as much as possible.

SUMMARY OF THE INVENTION

The present invention is made in view of such background, and an object of the invention is to provide a power conversion device capable of housing many switching element modules in a compact space and cooling them effectively, while preventing the influence of a noise due to the magnetic parts from acting on the switching element modules as much as possible.

In order to achieve the above-mentioned object, according to a first feature of the present invention, there is provided a power conversion device comprising: a converter which includes a plurality of switching element modules and a plurality of magnetic parts, and steps up or down a voltage of a direct current power supply; and an inverter which includes a plurality of switching element modules other than the switching element modules of the converter and converts the direct current voltage obtained by the converter into an alternating voltage to drive an electric motor, wherein the plurality of magnetic parts are arranged above a switching element assembly unit with a water-cooled type second heat sink interposed between the switching element assembly unit and the plurality of magnetic parts, the switching element assembly unit configured by mounting all the switching element modules on upper and lower surfaces of a water-cooled type first heat sink.

According to the configuration of the first feature, the switching element assembly unit is configured by mounting the multiple switching element modules constituting part of the converters and the inverter on the upper and lower surfaces of the water-cooled type first heat sink, and the multiple magnetic parts are arranged above the switching element assembly unit with the water-cooled type second heat sink interposed between the switching element assembly unit and the multiple magnetic parts. This allows the power conversion device to be compact, while allowing the multiple switching element modules and magnetic parts to be cooled efficiently. In addition, an influence of a noise of the magnetic parts can be prevented from acting on the switching element modules by the second heat sink.

According to a second feature of the present invention, in addition to the first feature, a plurality of stud bolts each having threaded shank portions at opposite ends thereof are implanted in the first heat sink in such a manner that the threaded shank portions project from the upper and lower surfaces of the first heat sink, and the switching element modules are mounted on the upper and lower surfaces of the first heat sink in such a manner that the switching element modules are fastened to the threaded shank portions of selected stud bolts out of the stud bolts.

According to the above configuration, the switching element modules can be easily mounted on the upper and lower surfaces of the first heat sink by using few components.

According to a third feature of the present invention, in addition to the first or second feature, a cooling water supply source is connected in parallel to the first and second heat sinks in order to distribute and supply cooling water to the first and second heat sinks.

According to the above configuration, optimal cooling performance can be obtained for cooling the switching element modules and the magnetic parts.

According to a fourth feature of the present invention, in addition to the first feature, an even number of the switching element modules are mounted on the upper and lower surfaces of the first heat sink in a substantially symmetrical arrangement with respect to the first heat sink.

According to the above configuration, the cooling performance for each switching element module can be optimized.

According to a fifth feature of the present invention, in addition to the first feature, the plurality of switching element modules that constitute part of the converter and mounted on the upper and lower surfaces of the first heat sink, and magnetic parts that are directly coupled to the switching element modules constituting part of the converter out of all the magnetic parts, are connected to each other by bus bars.

According to the above configuration, the switching element assembly unit is configured by mounting the switching element modules of the converter on the first heat sink, multiple magnetic parts in the converter are arranged above the switching element assembly unit with the second heat sink interposed between the switching element assembly unit and the multiple magnetic parts; and the switching element modules and the magnetic parts directly coupled to each other are connected by the bus bars. Thus, the lengths of the bus bars can be minimized, and the assembly can be made easier.

According to a sixth feature of the present invention, in addition to the first feature, the plurality of magnetic parts and a capacitor unit are disposed above the switching element assembly unit with the second heat sink interposed between the switching element assembly unit and the plurality of magnetic parts and between the switching element assembly unit and the capacitor unit, the capacitor unit formed by integrally including input capacitors respectively included in first and second converters which step up or down voltages of a pair of the direct current power supplies.

According to the above configuration, the capacitor unit is formed by integrally including the input capacitors respectively included in the pair of converters. Compact arrangement of the both input capacitors allows the power conversion device to be compact, while heat transfer from the switching element modules side to the both input capacitors can be suppressed by the second heat sink.

According to a seventh feature of the present invention, in addition to the sixth feature, the capacitor unit includes a single grounding terminal common to the both input capacitors.

According to the above configuration, since the capacitor unit has the single grounding terminal common to the both input capacitors, not only the capacitor unit can be made more compact, but also its wiring inductance can be reduced.

According to an eighth feature of the present invention, in addition to the first feature, a DC link capacitor unit having a smoothing capacitor is provided between the converter and the inverter, positive side connection terminals of the plurality of switching element modules mounted on the upper and lower surfaces of the first heat sink are connected to positive side connection terminals provided on the DC link capacitor unit and are also connected in common to a positive side external bus bar, negative side connection terminals of the plurality of switching element modules mounted on the first heat sink are connected to negative side connection terminals provided on the DC link capacitor unit and are also connected in common to a negative side external bus bar, and the positive side and negative side external bus bars arranged outside the DC link capacitor unit are stacked with an insulating member interposed between the positive side and negative side external bus bars to be integrated into an external bus bar unit.

According to the above configuration, the current flowing through the internal wiring of the DC link capacitor unit is decreased. Thus, the internal wiring of the DC link capacitor unit is prevented from generating heat which causes an adverse thermal effect on the smoothing capacitor.

According to a ninth feature of the present invention, in addition to the eighth feature, the external bus bar unit is in direct contact with the first heat sink.

According to the above configuration, the heat generated in the external bus bar unit is directly transferred to the first heat sink side so that a temperature rise near the DC link capacitor unit can be suppressed.

The above and other objects, characteristics and advantages of the present invention will be clear from detailed descriptions which will be provided below for the preferred embodiment while referring to the attached drawings.

BRIEF DESCRIPTION OF THE DRAWINGS

FIGS. 7A and 7B are diagrams showing a longitudinal sectional view of the switching element assembly unit and a change of a thermal conductivity in a direction of cooling water circulation in a first heat sink in comparison.

DESCRIPTION OF THE PREFERRED EMBODIMENT

Figure 1:
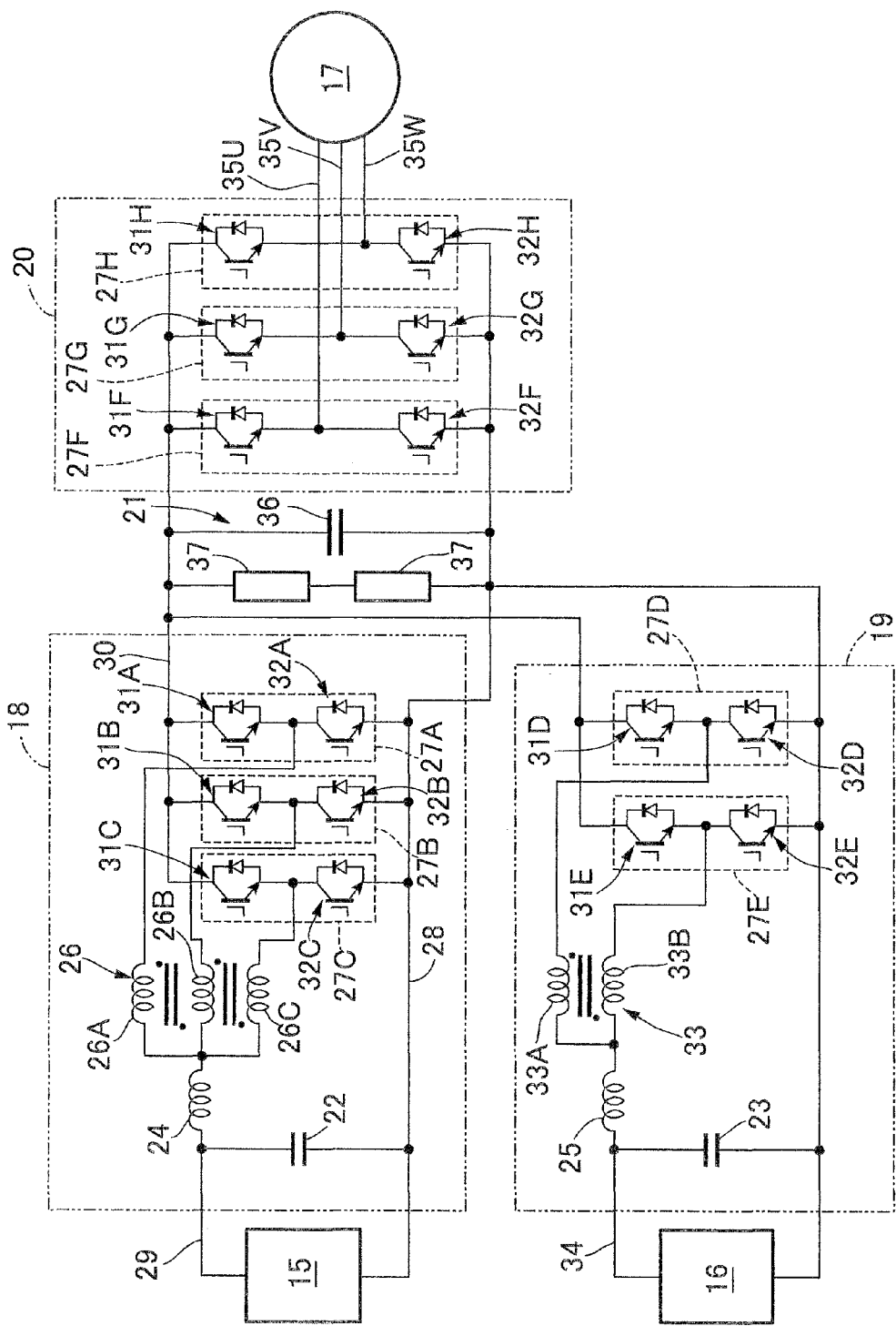
FIG. 1 is an overall schematic circuit diagram of a power conversion device.

In the following, an embodiment of the present invention is described referring to FIGS. 1 to 21. At first, referring to FIG. 1, a power conversion device is a device to be installed in a vehicle to convert direct current power obtained from a fuel cell 15, which is a first direct current power supply, and direct current power obtained from a storage battery 16, which is a second direct current power supply, into three-phase alternating current power to be supplied to an electric motor 17 generating power to drive a driving wheel. The power conversion device includes a first converter 18 which steps up or down the direct current voltage obtained from the fuel cell 15, a second converter 19 which steps up or down the direct current voltage obtained from the storage battery 16, an inverter 20 which converts the direct current voltage from the first and second converters 18 and 19 into an alternating voltage to drive the electric motor 17, and a DC link capacitor unit 21 provided between the both converters 18, 19 and the inverter 20.

The first converter 18 includes a first input capacitor 22, a first inductor 24, a three-phase transformer 26, a first, a second, and a third switching element modules 27A, 27B, and 27C. The three-phase transformer 26 has a primary winding 26A, a secondary winding 26B, and a tertiary winding 26C.

The negative terminal of the fuel cell 15 is connected to a ground line 28 common to the first converter 18, the second converter 19, and the inverter 20. The first input capacitor 22 is provided between the ground line 28 and a first input-side positive line 29, which is connected to the positive terminal of the fuel cell 15. One end of the first inductor 24 is connected to the first input-side positive line 29. Respective one ends of the primary winding 26A, the secondary winding 26B, and the tertiary winding 26C in the three-phase transformer 26 are connected in parallel to the other end of the first inductor 24.

The first switching element module 27A includes a first positive side switching element 31A and a first negative side switching element 32A. The first positive side switching element 31A is disposed between a common positive line 30 and the primary winding 26A of the three-phase transformer 26, the common positive line 30 being common to the first converter 18, the second converter 19, and the inverter 20. The first negative side switching element 32A is disposed between the primary winding 26A and the ground line 28. The second switching element module 27B includes a second positive side switching element 31B and a second negative side switching element 32B. The second positive side switching element 31B is disposed between the common positive line 30 and the secondary winding 26B of the three-phase transformer 26. The second negative side switching element 32B is disposed between the secondary winding 26B and the ground line 28. The third switching element module 27C includes a third positive side switching element 31C and a third negative side switching element 32C. The third positive side switching element 31C is disposed between the common positive line 30 and the tertiary winding 26C of the three-phase transformer 26. The third negative side switching element 32C is disposed between the tertiary winding 26C and the ground line 28.

The second converter 19 includes a second input capacitor 23, a second inductor 25, a two-phase transformer 33 having a primary winding 33A and a secondary winding 33B, and a fourth and a fifth switching element modules 27D and 27E.

The second input capacitor 23 is provided between a second input-side positive line 34 connected to the positive side terminal of the storage battery 16 and the ground line 28 connected to the negative side terminal of the storage battery 16. One end of the second inductor 25 is connected to the second input-side positive line 34. Respective one ends of the primary winding 33A and the secondary winding 33B in the two-phase transformer 33 are connected in parallel to the other end of the second inductor 25.

The fourth switching element module 27D includes a fourth positive side switching element 31D and a fourth negative side switching element 32D. The fourth positive side switching element 31D is disposed between the common positive line 30 and the primary winding 33A of the two-phase transformer 33. The fourth negative side switching element 32D is disposed between the primary winding 33A and the ground line 28. The fifth switching element module 27E includes a fifth positive side switching element 31E and a fifth negative side switching element 32E. The fifth positive side switching element 31E is disposed between the common positive line 30 and the secondary windings 33B of the two-phase transformer 33. The fifth negative side switching element 32E is disposed between the secondary winding 33B and the ground line 28.

The inverter 20 includes a sixth, a seventh, and an eighth switching element modules 27F, 27G, and 27H.

The sixth switching element module 27F includes a sixth positive side switching element 31F and a sixth negative side switching element 32F. The sixth positive side switching element 31F is disposed between the common positive line 30 and a U-phase power supply line 35U connected to the electric motor 17 being a three-phase AC motor. The sixth negative side switching element 32F is disposed between the U-phase power supply line 35U and the ground line 28. The seventh switching element module 27G includes a seventh positive side switching element 31G and a seventh negative side switching element 32G. The seventh positive side switching element 31G is disposed between the common positive line 30 and a V-phase power supply line 35V connected to the electric motor 17. The seventh negative side switching element 32G is disposed between the V-phase power supply line 35V and the ground line 28. The eighth switching element module 27H includes an eighth positive side switching element 31H and an eighth negative side switching element 32H. The eighth positive side switching element 31H is disposed between the common positive line 30 and a W-phase power supply line 35W connected to the electric motor 17. The eighth negative side switching element 32H is disposed between the W-phase power supply line 35W and the ground line 28.

Now, in this embodiment, the first to eighth positive side switching elements 31A to 31H and the first to eighth negative side switching elements 32A to 32H in the first to eighth switching element modules 27A to 27H each includes an Insulated Gate Bipolar Transistor (IGBT), and a diode connected in parallel to each IGBT with a forward direction being a direction from an emitter to a collector.

The DC link capacitor unit 21 includes smoothing capacitors 36 provided between the common positive line 30 and the ground line 28. Although only one smoothing capacitor 36 is shown for the sake of simplicity in FIG. 1, the DC link capacitor unit 21 includes the smoothing capacitors 36 corresponding to respective phases of U-phase, V-phase, and W-phase of the three-phase AC electric motor 17, which are provided between the common positive line 30 and the ground line 28.

A series circuit including a pair of discharge resistances 37 is connected between the common positive line 30 and the ground line 28.

Figure 2:
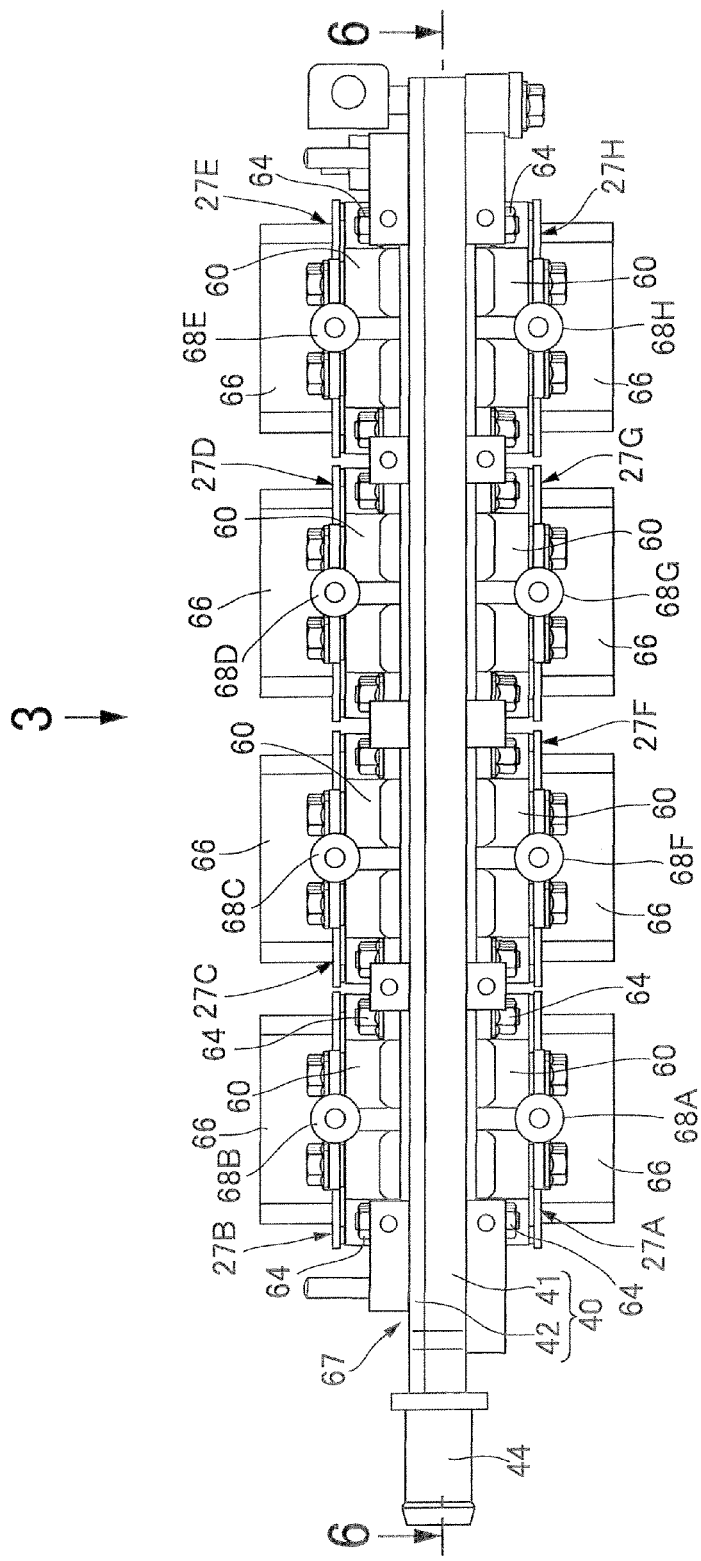
FIG. 2 is a side view of a switching element assembly unit.
Figure 3:
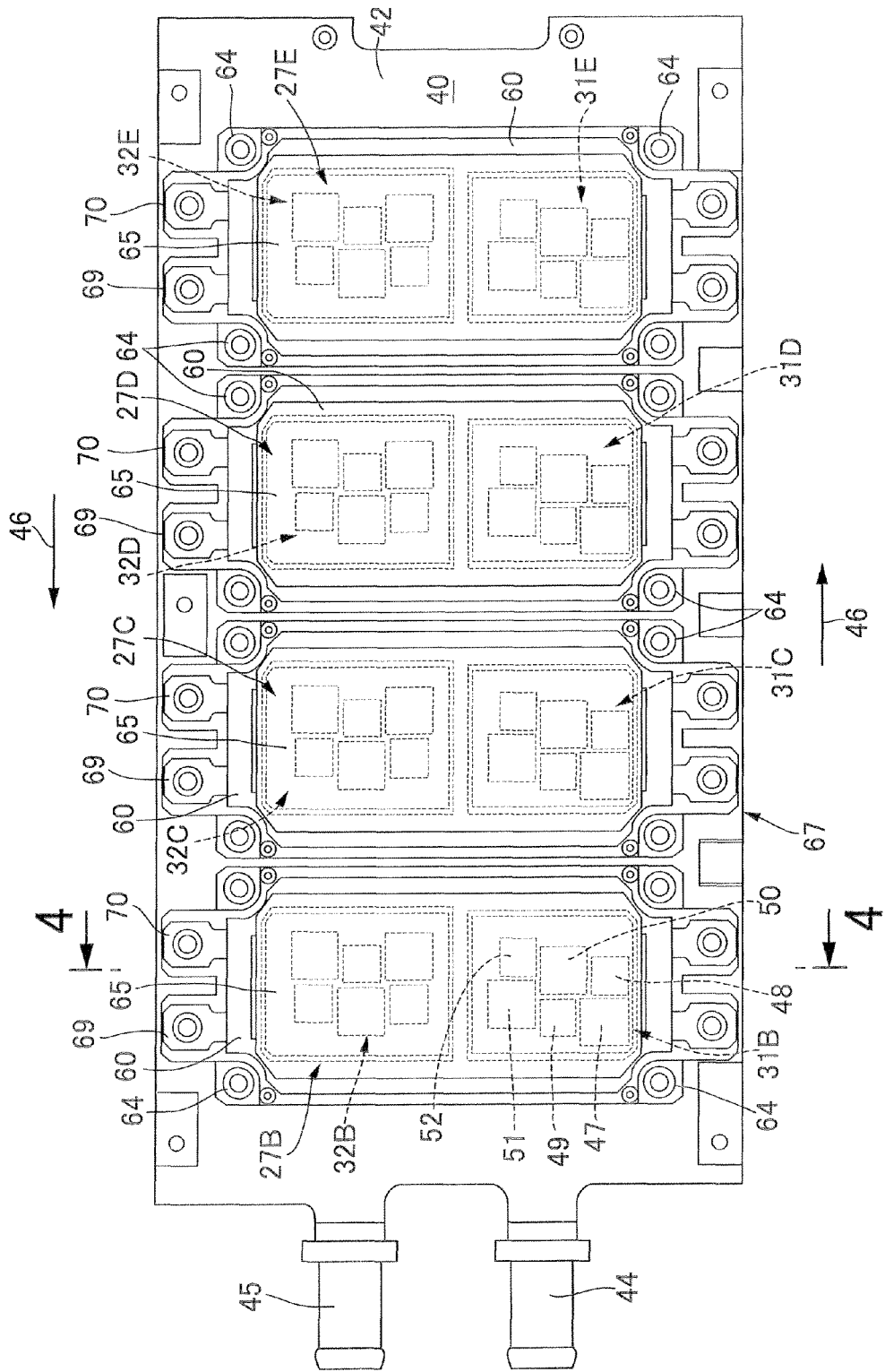
FIG. 3 is a diagram viewed from an arrow 3 in FIG. 2 with a control circuit omitted.

Referring to both FIGS. 2 and 3, the first, second, and third switching element modules 27A, 27B, 27C included in the first converter 18, the fourth and fifth switching element modules 27D, 27E included in the second converter 19, and the sixth, seventh, and eighth switching element modules 27F, 27G, 27H included in the inverter 20 are disposed on the upper and lower surfaces of a water-cooled type first heat sink 40.

Figure 4:
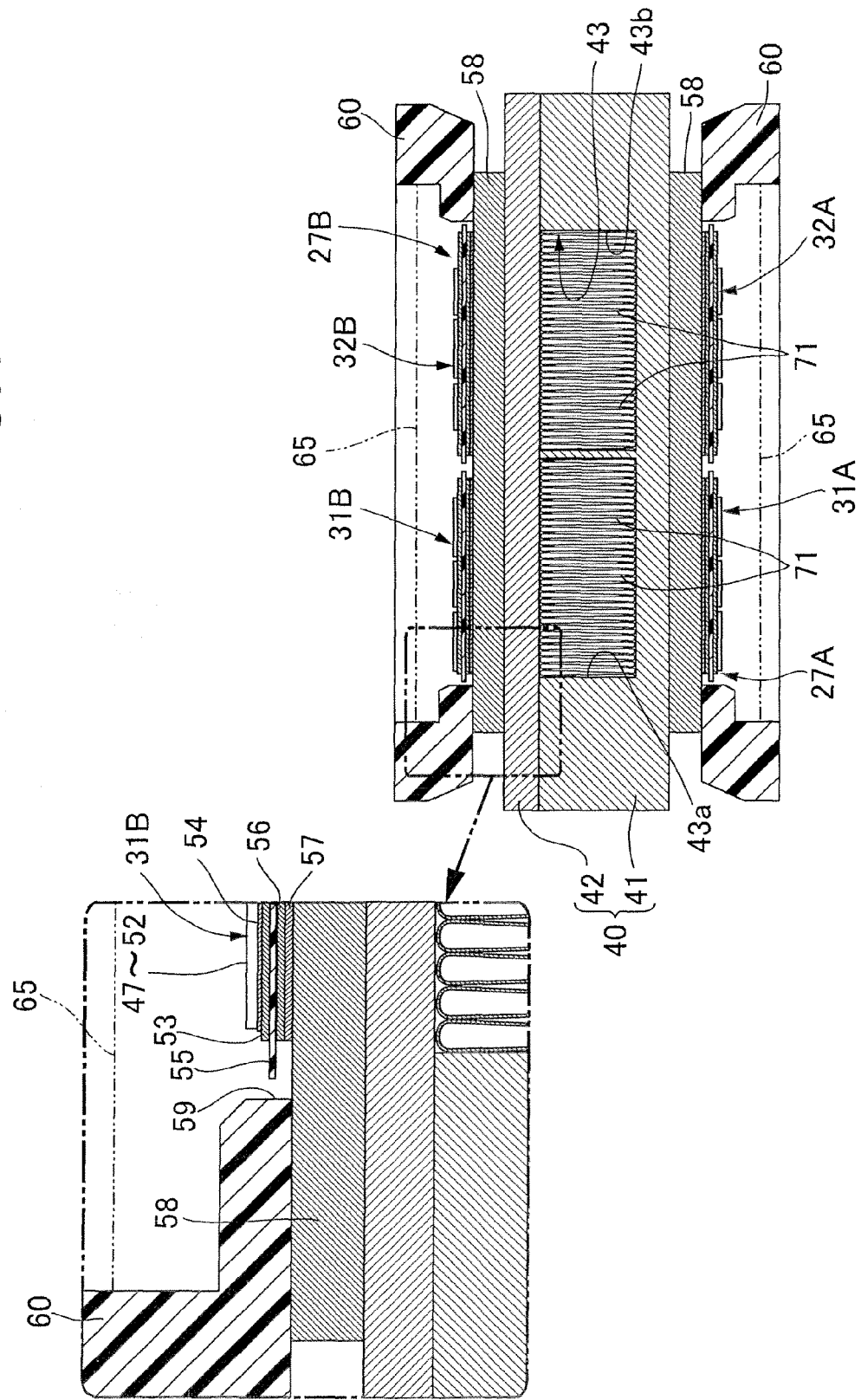
FIG. 4 is a cross-sectional view taken along a line 4-4 in FIG. 3.
Figure 5:
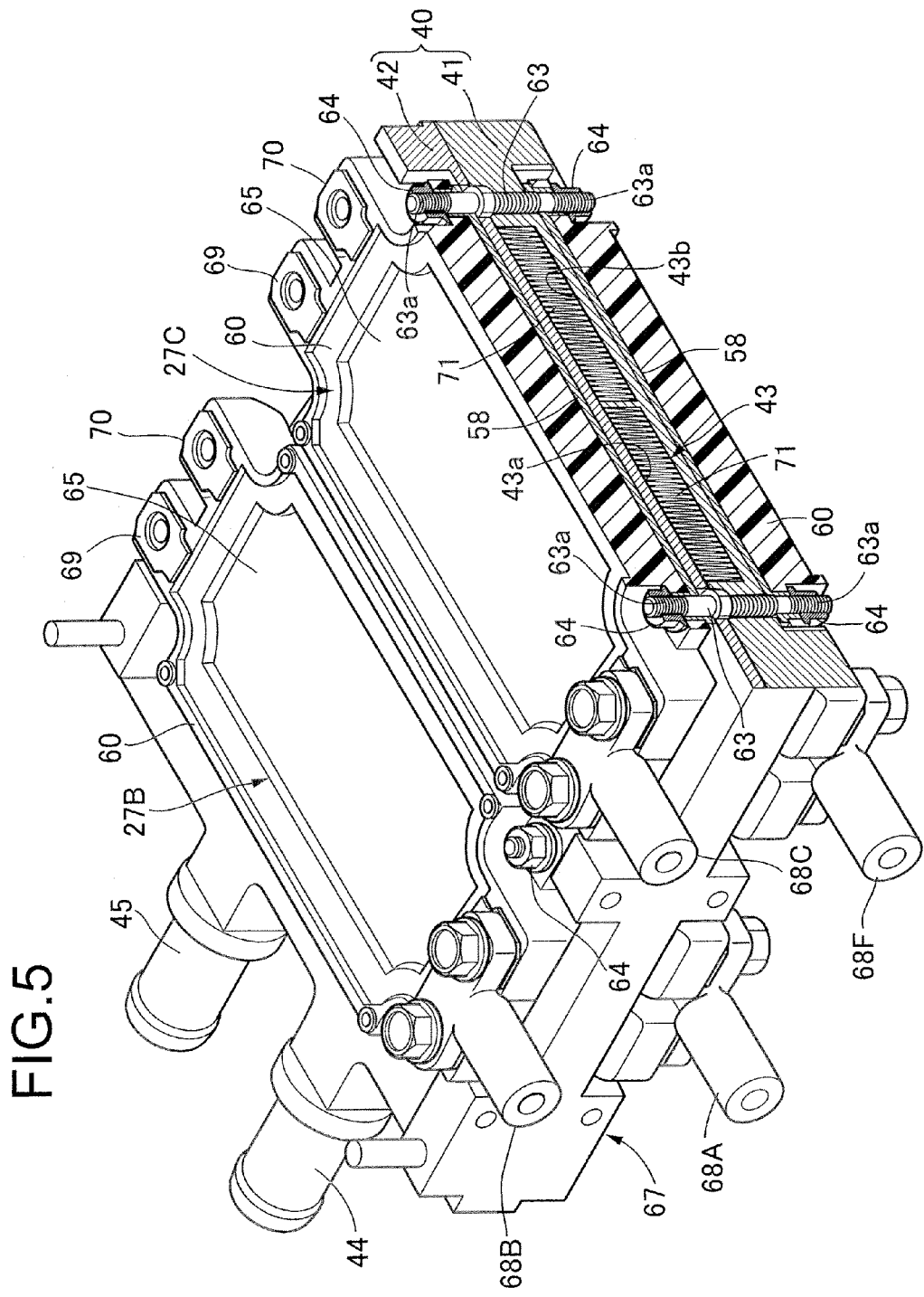
FIG. 5 is a cutaway perspective view of an essential portion of the switching element assembly unit.
Figure 6:
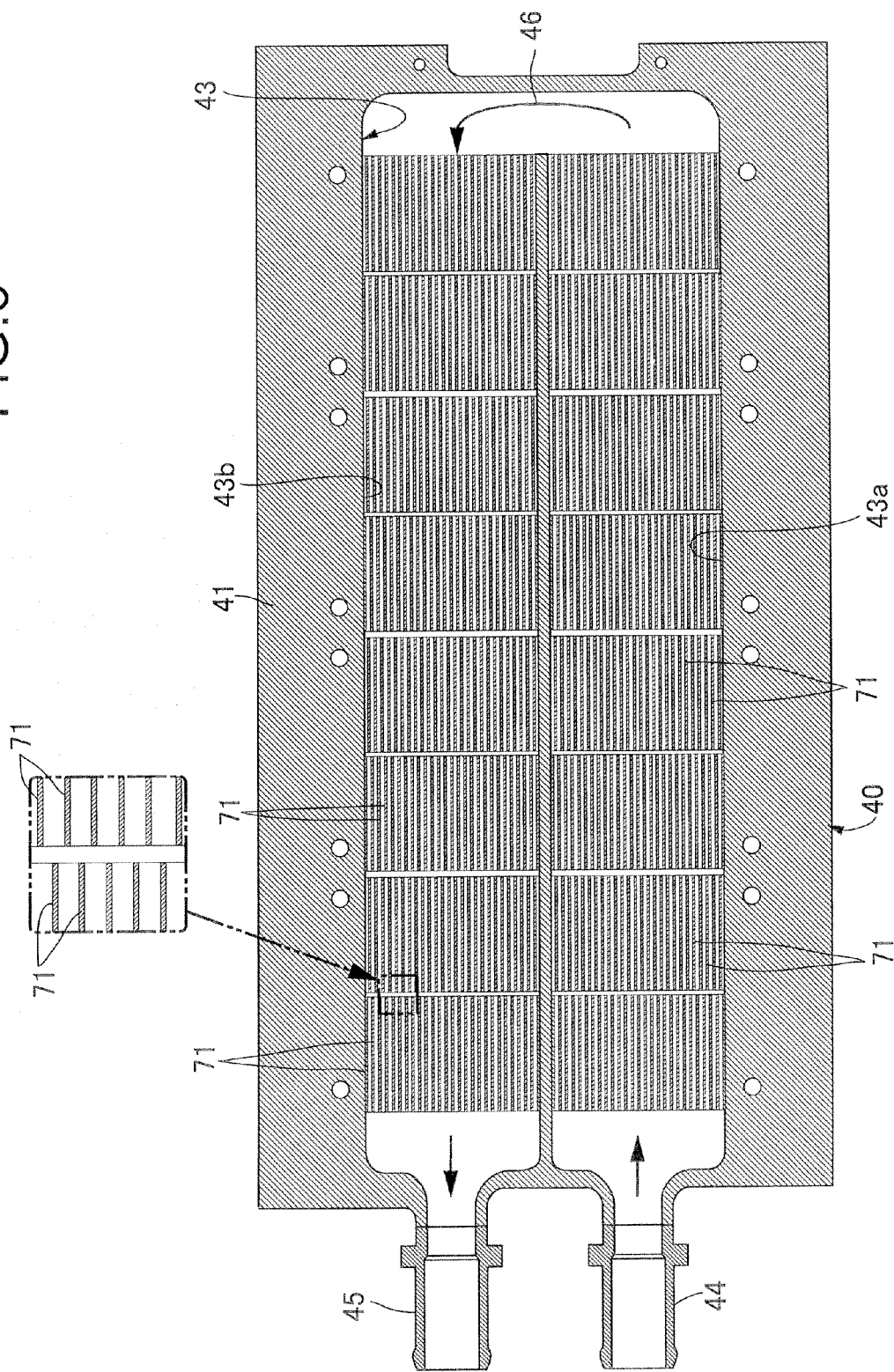
FIG. 6 is a cross-sectional view taken along a line 6-6 in FIG. 2.
Figure 8:
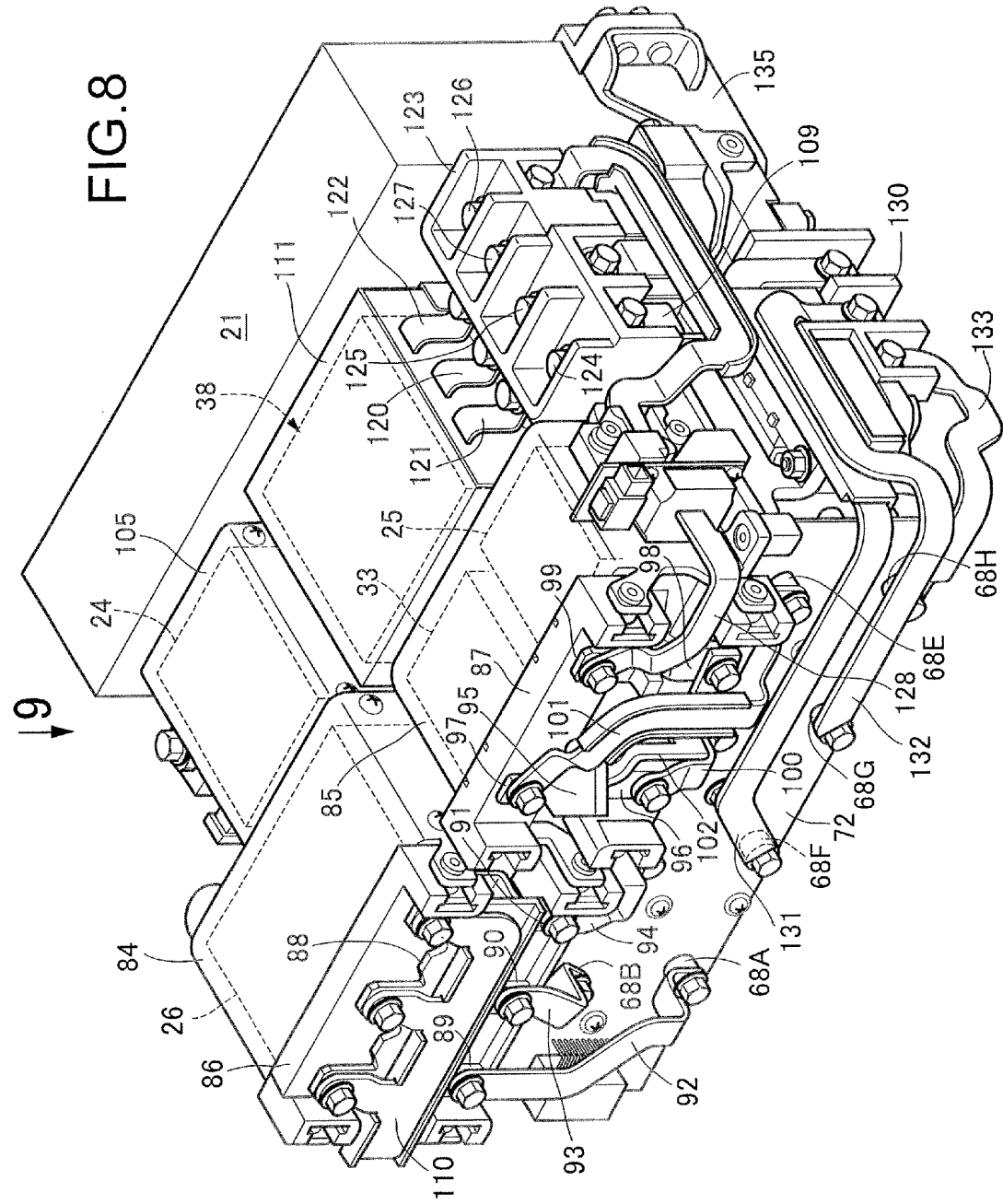
FIG. 8 is a perspective view of the power conversion device.
Figure 9:
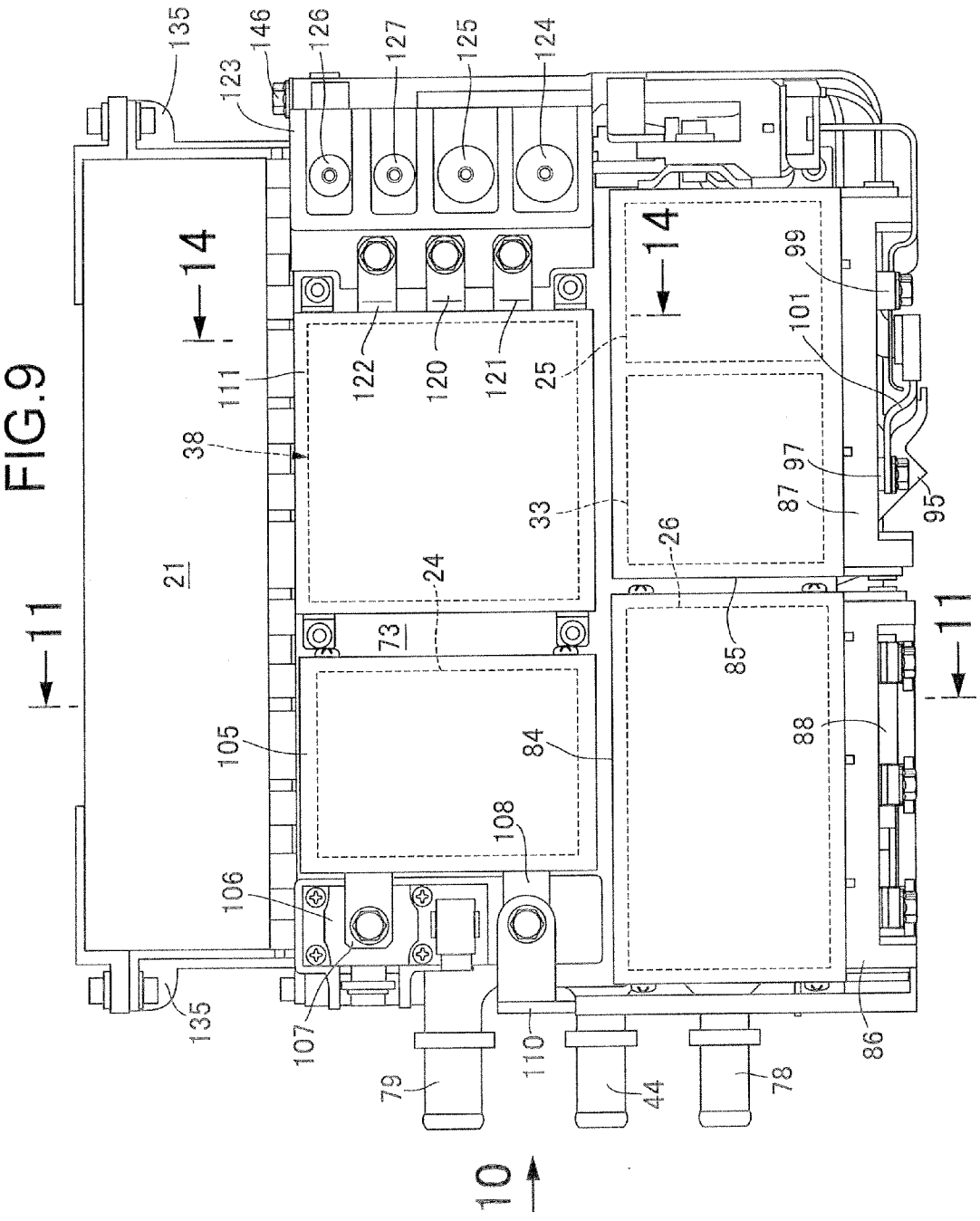
FIG. 9 is a plan view viewed from an arrow 9 in FIG. 8.
Figure 10:
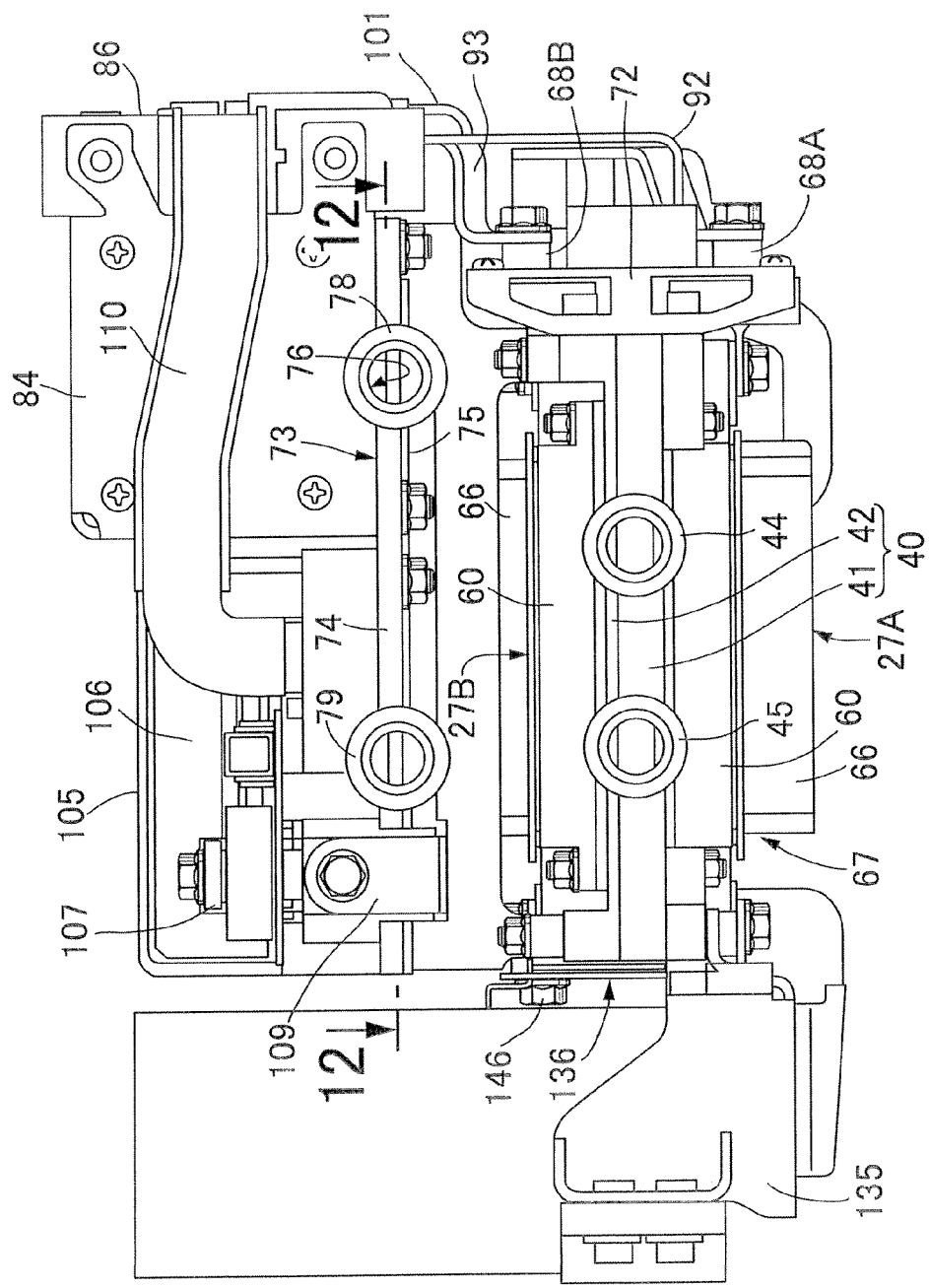
FIG. 10 is a diagram viewed from an arrow 10 in FIG. 9.

Further referring to FIGS. 4 to 6 together, the first heat sink 40 includes a heat sink body 41 formed extending longer in one direction, and a lid 42 coupled to the heat sink body 41 from above to form a first cooling water passage 43 between the heat sink body 41 and the lid 42. Thus, the first cooling water passage 43 is formed in such a manner that an outward passage portion 43a extending in the longitudinal direction of the heat sink 40 from one end of the first heat sink 40 to the other end thereof and a return passage portion 43b extending in parallel to the outward passage portion 43a from the other end of the first heat sink 40 to the one end thereof communicate with each other at the other end side of the first heat sink 40. One end of the first heat sink 40 includes a cooling water inlet pipe 44 leading to the outward passage portion 43a in the first cooling water passage 43 and a cooling water outlet pipe 45 leading to the return passage portion 43b in the first cooling water passage 43. The cooling water introduced from the cooling water inlet pipe 44 into the first cooling water passage 43 flows to the other end side of the first heat sink 40 through the outward passage portion 43a along the circulation direction shown by an arrow 46 in FIG. 6. The cooling water further flows around to the return passage portion 43b side at the other end side of the first heat sink 40 and is drawn from the cooling water outlet pipe 45 at the one end side of the first heat sink 40.

Incidentally, the first converter 18 includes three switching element modules, i.e., the first, second, and third switching element modules 27A, 27B, 27C, the second converter 19 includes two switching element modules, i.e., the fourth and fifth switching element modules 27D, 27E, and the inverter 20 includes three switching element modules, i.e., the sixth, seventh, and eighth switching element modules 27F, 27G, 27H. Thus, an even number of switching element modules are disposed on the upper and the lower surfaces of the first heat sink 40, specifically, eight switching element modules 27A to 27H in this embodiment. These switching element modules 27A to 27H are mounted on the upper and lower surfaces of the first heat sink 40 in a substantially symmetrical arrangement with respect to the first heat sink 40.

When the heat generation amount of the first to third switching element modules 27A to 27C is e.g. 700 W, the heat generation amount of the fourth and the fifth switching element modules 27D, 27E is e.g. 500 W, and the heat generation amount of the sixth to eighth switching element modules 27F to 27H is e.g. 1100 W. Thus, a switching element module with a higher heat generation amount is disposed on the first heat sink's 40 lower surface where cooling is easier, while the first to eighth switching element modules 27A to 27H are mounted on the upper and lower surfaces of the first heat sink 40 in an substantially symmetrical arrangement with respect to the first heat sink 40. In the present embodiment, the second and third switching element modules 27B, 27C, and the fourth and fifth switching element modules 27D, 27E are disposed on the upper surface of the first heat sink 40, while the first switching element module 27A, and the sixth, seventh, and eighth switching element modules 27F, 27G, 27H are disposed on the lower surface of the first heat sink 40.

Directing attention to FIG. 4, the first to eighth switching element modules 27A to 27H are on the upper and lower surfaces of the first heat sink 40 in such a manner that the first to eighth positive side switching elements 31A to 31H are arranged at one side of the first heat sink 40 in its width direction, i.e., the outward passage portion 43a side of the first cooling water passage 43 in the present embodiment, while the first to eighth negative side switching elements 32A to 32H are arranged at the other side of the first heat sink 40 in its width direction, i.e., the return passage portion 43b side of the first cooling water passage 43 in the present embodiment.

The multiple chips included in each of the first to eighth positive side switching elements 31A to 31H and the first to eighth negative side switching elements 32A to 32H, i.e., six chips 47, 48, 49, 50, 51, 52 in the present embodiment, are arranged in such a manner that every two chips are aligned side-by-side along the circulation direction 46 of the cooling water in the first cooling water passage 43 as shown in FIG. 3. As shown in FIG. 4, the chips are disposed on a copper electrode 53 with a solder layer 54 interposed therebetween. A copper electrode 56 interposing an insulating substrate 55 between itself and the copper electrodes 53, is fixed to a copper base plate 58 with a solder layer 57 interposed between the copper electrode 56 and the copper base plate 58.

Synthetic resin cases 60 formed in a rectangular frame shape are arranged on the copper base plate 58. Each case 60 has an opening 59 to dispose corresponding one of pairs of the first to eighth positive side switching elements 31A to 31H and the first to eighth negative side switching elements 32A to 32H for the first to eighth switching element modules 27A to 27H, respectively. The copper base plates 58 and the cases 60 are fixed to the first heat sink 40.

On the first heat sink 40, as clearly shown in FIG. 5, multiple stud bolts 63 each having threaded shank portions 63a at opposite ends thereof are implanted at the positions corresponding to four corners of each case 60 in such a manner that the threaded shank portions 63a project from the upper and lower surfaces of the first heat sink 40. The cases 60 and the copper base plates 58 of the first to eighth switching element modules 27A to 27H are secured by fastening the nuts 64 engaging with the threaded shank portions 63a of selected ones of stud bolts 63 out of all the stud bolts 63, and thereby the first to eighth switching element modules 27A to 27H are mounted on the upper and lower surfaces of the first heat sink 40.

Also a coated layer 65 made of a synthetic resin is formed inside each case 60 so as to embed therein the chips 47 to 52, the copper electrode 53, the solder layer 54, the insulating substrate 55, the copper electrode 56, and the solder layer 57. The first to eighth positive side switching elements 31A to 31H and the first to eighth negative side switching elements 32A to 32H of the first to the eighth switching element modules 27A to 27H are sealed inside the coated layer 65. Also, each case 60 is mounted with a control circuit 66 to control switching on/off of the corresponding one of first to eighth positive side switching elements 31A to 31H and the corresponding one of first to eighth negative side switching elements 32A to 32H of the first to eighth switching element modules 27A to 27H, in a manner that each control circuits 66 cover the corresponding one of first to eighth switching element modules 27A to 27H.

The first heat sink 40, the first to eighth switching element modules 27A to 27H mounted on the upper and lower surfaces of the first heat sink 40, and the control circuits 66 form a switching element assembly unit 67.

Now, the first to eighth switching element modules 27A to 27H are mounted to the first heat sink 40 in such a manner that terminals to be connected to the three-phase transformer 26, the two-phase transformer 33, and the electric motor 17 are arranged at one side of the first heat sink 40 in its width direction. Terminal members 68A, 68B, 68C of the first to third switching element modules 27A to 27C, which are coupled to the terminals to be connected to the three-phase transformer 26, terminal members 68D, 68E of the fourth and fifth switching element modules 27D, 27E, which are coupled to the terminals to be connected to the two-phase transformer 33, and terminal members 68F, 68G, 68H of the sixth to eighth switching element modules 27F to 27H, which are coupled to the terminal to be connected to the electric motor 17 are mounted on the cases 60 so as to be arranged on one side of the first heat sink 40 in its width direction.

A positive side connection terminal 69 to be connected to the common positive line 30 and a negative side connection terminals 70 to be connected to the ground line 28 in each of the switching element modules 27A to 27H are mounted on the case 60 in a side-by-side arrangement for each of the switching element modules 27A to 27H at the other side of the first heat sink 40 in its width direction.

The first cooling water passage 43 included in the first heat sink 40 has multiple cooling fins 71. The cooling fins 71 are configured by arranging in parallel multiple plate members formed of a light metal such as aluminum alloy with V-shaped cross sections in a direction perpendicular to the circulation direction 46. The cooling fins 71 are disposed along the circulation direction 46 while dividing the inside of the first cooling water passage 43 into multiple portions in the width direction.

On the other hand, the multiple chips 47 to 52 included in each of the first to eighth positive side switching elements 31A to 31H and the first to eighth negative side switching elements 32A to 32H of the first to eighth switching element modules 27A to 27H are arranged by twos side-by-side along the circulation direction 46 of the cooling water in the first cooling water passage 43, i.e., the chips 47, 48, the chips 49, 50, and the chips 51, 52 are arranged in such a manner that each pair is aligned side-by-side along the circulation direction 46. As shown in FIG. 7A, a set of the cooling fins 71 is separately arranged for each of sets of chips aligned along the circulation direction 46, i.e., the sets of chips 47, 49, 51 and the sets of chips 48, 50, 52. In addition, as clearly shown in FIG. 6, the sets of cooling fins 71 for the set of chips 47, 49, 51 are arranged to be offset from the sets of cooling fins 71 for the set of chips 48, 50, 52 in a direction perpendicular to the circulation direction 46.

By the way, it is known that when cooling water flows through each of the cooling fins 71, a thermal entrance region exists near the inlet of each of the cooling fins 71 due to a change in the flow velocity distribution. In the entrance region, the thermal conductivity decreases in a downstream direction, and approaches to a certain thermal conductivity in a hydrodynamically developed region where the flow velocity becomes constant after the cooling water passes through the entrance region. Though relatively high thermal conductivity is achieved in the entrance region, in the hydrodynamically developed region, a boundary layer with the surface of the cooling fin 71 becomes thick and the heat transfer efficiency is reduced. Accordingly, when long, continuous fins are disposed along the circulation direction 46 in the first cooling water passage 43, it is difficult to obtain a high cooling efficiency across the entire first cooling water passage 43. However, as described above, the set of cooling fins 71 is separately arranged for each of the sets of chips of 47, 49, 51 and the sets of chips 48, 50, 52 aligned along the circulation direction 46, and also the sets of cooling fins 71 for the set of chips 47, 49, 51 are arranged to be offset from the sets of cooling fins 71 for the set of chips 48, 50, 52 in a direction perpendicular to the circulation direction 46. Accordingly, a thermal entrance region as shown in FIG. 7B can be formed at an inlet of each set of the cooling fins 71 separately arranged for the corresponding one of sets of chips 47, 49, 51 and sets of chips 48, 50, 52 aligned along the circulation direction 46. Thus, it becomes possible to obtain a high cooling efficiency across the entire first cooling water passage 43.

Referring to FIGS. 8 to 11 together, at one side of the switching element assembly unit 67, a substrate 72 to dispose a current sensor and the like is arranged in a manner that the terminal members 68A to 68H mounted to the cases 60 arranged at the one side of the first heat sink 40 in its width direction penetrates the substrate 72. The substrate 72 is fixed to the first heat sink 40. Above the switching element assembly unit 67, a second heat sink 73 is arranged. The first inductor 24 and the three-phase transformer 26 in the first converter 18, the second inductor 25 and the two-phase transformer 33 in the second converter 19, a capacitor unit 38 configured by integrating the first input capacitor 22 of the first converter 18 and the second input capacitor 23 of the second converter 19 are arranged above the second heat sink 73 with the second heat sink 73 interposed between the switching element assembly units 67 and the components.

The second heat sink 73 includes a heat sink body 74 formed extending longer in the same direction as the longitudinal direction of the first heat sink 40, and a lid 75 coupled to the heat sink body 74 from below to form a second cooling water passage 76 between the heat sink body 74 and the lid 75. The second heat sink 73 is formed to be thinner than the first heat sink 40.

Figure 12:
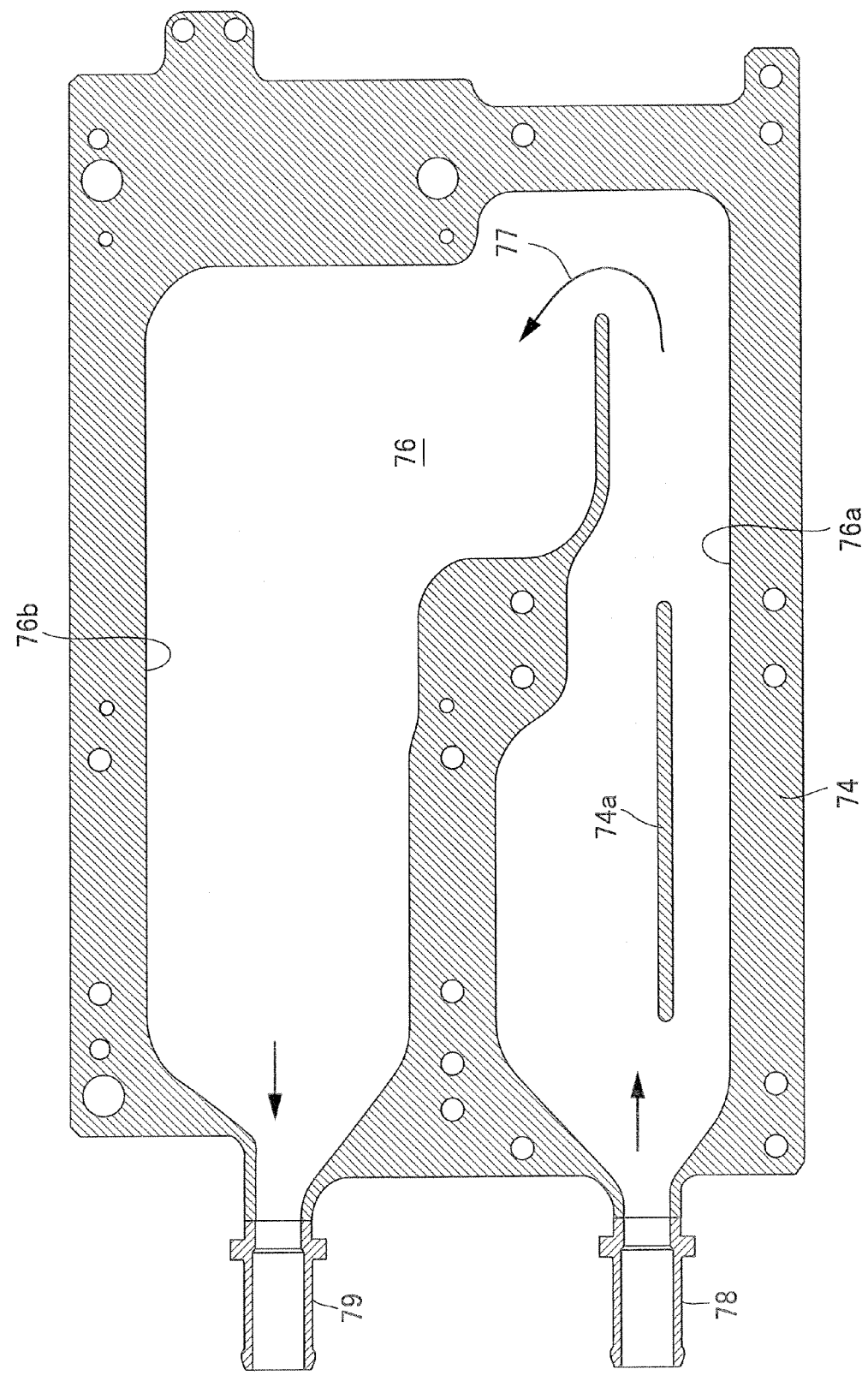
FIG. 12 is a cross-sectional view of a second heat sink taken along a line 12-12 in FIG. 10.

In FIG. 12, the second cooling water passage 76 is formed between the heat sink body 74 and the lid 75 in such a manner that an outward passage portion 76a extending in the longitudinal direction of the heat sink 73 from one end of the second heat sink 73 toward the other end thereof and a return passage portion 76b extending in parallel to the outward passage portion 76a from the other end of the second heat sink 73 toward the one end thereof communicate with each other at the other end side of the second heat sink 73. One end of the second heat sink 73 includes a cooling water inlet pipe 78 leading to the outward passage portion 76a and a cooling water outlet pipe 79 leading to the return passage portion 76b. The cooling water introduced from the cooling water inlet pipe 78 into the second cooling water passage 76 flows to the other end side of the second heat sink 73 through the outward passage portion 76a of the second cooling water passage 76 along the circulation direction shown by an arrow 77. The cooling water further flows around to the return passage portion 76b side at the other end side of the second heat sink 73 and is drawn from the cooling water outlet pipe 79 at the one end side of the second heat sink 73. The heat sink body 74 in the second heat sink 73 is integrally provided with a straightening vane portion 74a, which is arranged in the outward passage portion 76a of the second cooling water passage 76 in a manner extending along the circulation direction 77.

Figure 13:
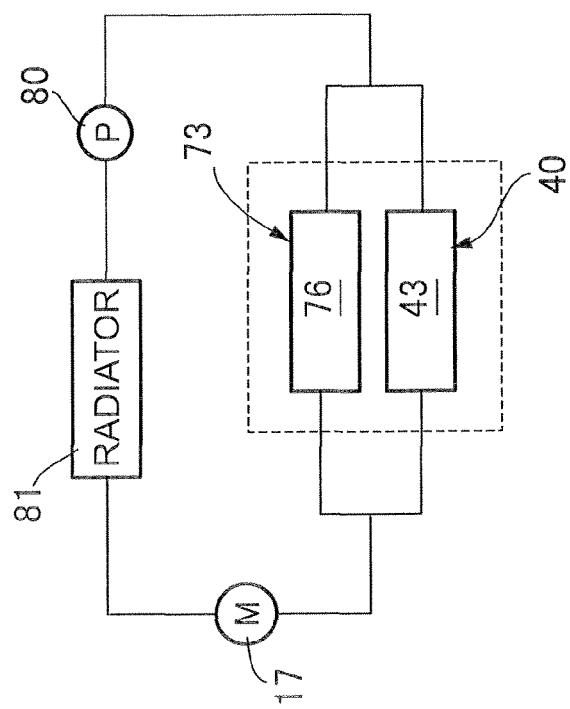
FIG. 13 is a diagram showing a circulation circuit of cooling water.

In FIG. 13, the first cooling water passage 43 in the first heat sink 40, and the second cooling water passage 76 in the second heat sink 73 are connected in parallel to an exhaust port of a cooling water pump 80 as a cooling water supply source. Cooling water drawn from the first and second cooling water passages 43 and 76 cools the electric motor 17, and is then cooled by a radiator 81 and returns to the intake port of the cooling water pump 80.

The three-phase transformer 26 of the first converter 18 is fixed on the second heat sink 73 so as to be arranged at a position at one side of the first and second heat sinks 40 and 73 in their width direction, i.e., the side at which substrate 72 is arranged, and at one end side of the first and second heat sinks 40 and 73, i.e., the side at which the cooling water inlet pipes 44, 78 and the cooling water outlet pipes 45, 79 are provided. A first cover 84 covering the three-phase transformer 26 is fixed to the second heat sink 73.

The two-phase transformer 33 of the second converter 19 is arranged at the one side of the first and second heat sinks 40, 73 in their width direction so as to be aligned with the three-phase transformer 26. The second inductor 25 of the second converter 19 is arranged at the one side of the first and second heat sinks 40, 73 in their width direction with the two-phase transformer 33 interposed between the second inductor 25 and the three-phase transformer 26. The two-phase transformer 33 and the second inductor 25 fixed on the second heat sink 73 are both covered with the second cover 85 fixed to the second heat sink 73. Also, a first terminal block 86 located above the substrate 72 is fixed to the first cover 84, and a second terminal block 87 located above the substrate 72 is fixed to the second cover 85.

The first terminal block 86 includes a common terminal 88 to connect the winding wires 26A, 26B, 26C of the three-phase transformer 26 to the first inductor 24, and individual terminals 89, 90, 91 to individually connect the winding wires 26A, 26B, 26C to the first to third switching element modules 27A to 27C, respectively. The individual terminals 89 to 91 are connected to the terminal members 68A, 68B, 68C, which penetrate through the substrate 72 while coupling to the terminals to be connected to the three-phase transformer 26 of the first to third switching element modules 27A to 27C, via bus bars 92, 93, 94 located outside the substrate 72, respectively.

The second terminal block 87 includes a common terminal 95 to connect the winding wires 33A, 33B of the two-phase transformer 26 to the second inductor 25, and individual terminals 96, 97 to connect the winding wires 33A, 33B to the fourth and fifth switching element module 27D, 27E, respectively. Here, the individual terminal 96 is arranged below the common terminal 95, and the individual terminal 97 is arranged above the common terminal 95. The second terminal block 87 also includes terminals 98, 99 which couple to opposite ends of the second inductor 25, respectively. The individual terminals 96, 97 are connected to terminal members 68D, 68E, which penetrate through the substrate 72 while coupling to the terminals to be connected to the two-phase transformer 33 of the fourth and fifth switching element modules 27D, 27E, via bus bars 100, 101 located outside the substrate 72, respectively. Also, the common terminal 95 and the terminal 98 are connected via a bus bar 102.

The first inductor 24 of the first converter 18 is fixed on the second heat sink 73 so as to be aligned with the three-phase transformer 26 at the other side of the first and second heat sinks 40, 73 in their width direction, i.e., the opposite side from where the substrate 72 is arranged, and at the one end side of the first and second heat sinks 40, 73, i.e., the side at which the cooling water inlet pipes 44, 78 and the cooling water outlet pipes 45, 79 are provided. A third cover 105 covering the first inductor 24 is fixed to the second heat sink 73. Also, a third terminal block 106 is fixed to the third cover 105 so as to be arranged at one end side of the first and second heat sinks 40, 73.

The third terminal block 106 includes terminals 107, 108 which couple to opposite ends of the first inductor 24, respectively. The one terminal 107 is connected to a bus bar 109 which extends to the other end side of the second heat sink 73 in its longitudinal direction between the switching element assembly unit 67 and the second heat sink 73. The other terminal 108 is connected to the common terminal 88 provided on the first terminal block 86 via a bus bar 110.

The capacitor unit 38 is fixed to the second heat sink 73 so as to be aligned with the first inductor 24 at the other side of the first and second heat sinks 40, 73 in their width direction, i.e., the opposite side from where the substrate 72 is arranged. The capacitor unit 38 is covered with a fourth cover 111 fixed to the second heat sink 73.

Figure 14:
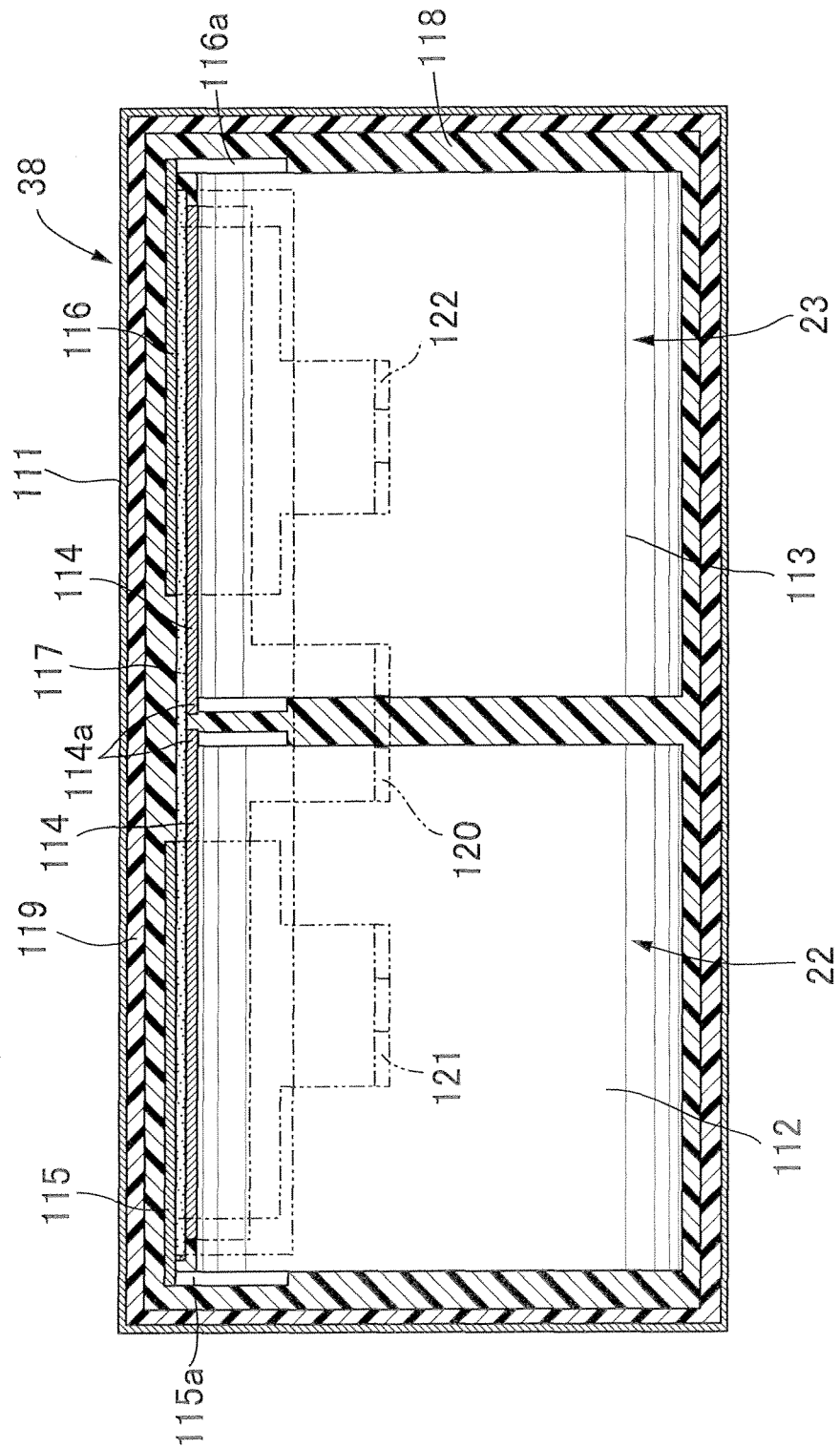
FIG. 14 is a cross-sectional view taken along a line 14-14 in FIG. 9.
Figure 15:
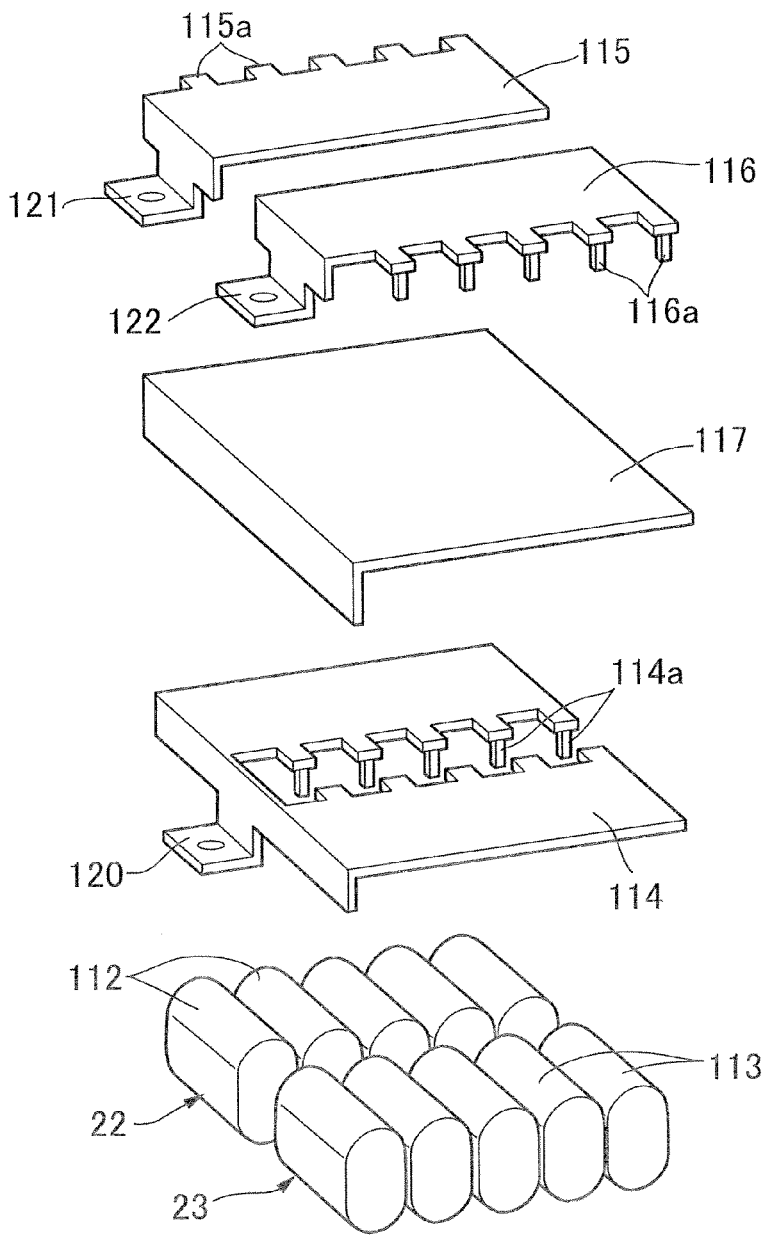
FIG. 15 is an exploded perspective view of a capacitor unit.

In FIGS. 14 and 15, the first input capacitor 22, which is a partial component of the capacitor unit 38, is configured by connecting multiple first capacitor devices 112 arranged in parallel. The second input capacitor 23, which is the rest of the components of the capacitor unit 38, is configured by connecting multiple second capacitor devices 113 aligned parallel to the arrangement direction of the first capacitor devices 112. The first capacitor devices 112 and the second capacitor devices 113, which are included in the same number, are arranged in such a manner that their negative sides face each other. A common bus bar 114, which has multiple negative side connection pieces 114a to be connected to the negative sides of the first and second capacitor devices 112, 113 by solder, is arranged so as to cover the first and second capacitor devices 112, 113 from the above. A first individual bus bar 115, which has multiple positive side connection pieces 115a to be connected to the positive sides of the first capacitor devices 112 by solder, and a second individual bus bar 116, which has multiple positive side connection pieces 116a to be connected to the positive sides of the second capacitor devices 113 by solder, are arranged on the common bus bar 114 with an insulating paper 117 interposed between the common bus bar 114 and the first individual bus bar 115, as well as between the common bus bar 114 and the second individual bus bar 116. The capacitor unit 38 configured by connecting the first and second capacitor devices 112, 113 with the common bus bar 114 and the first and second bus bars 115, 116 is housed in a case 119 so as to be embedded in a coated layer 118 made of a synthetic resin, and the case 119 is covered with the fourth cover 111.

Also, the common bus bar 114 is integrally provided with a grounding terminal 120, which is common to the first and second input capacitors 22, 23, and projects from the coated layer 118. The first and second individual bus bars 115, 116 are integrally provided with projecting positive terminals 121, 122 corresponding to the first and second input capacitors 22, 23, respectively, in a manner that the positive terminals 121, 122 interpose the grounding terminal 120 therebetween. Both positive terminals 121 and 122 also project from the coated layer 118.

A fourth terminal block 123 is fixed on the other end of the second heat sink 73, at such position where the fourth terminal block 123 and the first inductor 24 interpose the capacitor unit 38. The fourth terminal block 123 includes positive side and negative side terminals 124, 125 for fuel cell to be connected to the fuel cell 15, and positive side and negative side terminals 126, 127 for storage battery to be connected to the storage battery 16.

The positive terminal 121 of the capacitor unit 38, and the bus bar 109 connected to the terminal 107 provided on the third terminal block 106 coupling to the first inductor 24 are connected to the fourth terminal block 123 so as to couple to the positive side terminal 124 for fuel cell. The positive terminal 122 of the capacitor unit 38, and a bus bar 128 connected to the terminal 99 provided on the second terminal block 87 so as to couple to the second inductor 25 are connected to the fourth terminal block 123 so as to couple to the positive side terminal 126 for storage battery.

A fifth terminal block 130 to be connected to the U-phase, V-phase, and W-phase power supply lines 35U, 36V, and 35W coupled to the electric motor 17 is fixed to the other end of the first heat sink 40. Bus bars 131, 132, 133, whose respective one ends are connected to the terminal members 68F to 68H of the sixth to eighth switching element modules 27F to 27H which penetrate through the substrate 72 while coupling to the terminals to be connected to the electric motor 17, are extended to the fifth terminal block 130.

Now, on the opposite side of the substrate 72, the DC link capacitor unit 21 is arranged, which is supported on the first heat sink 40 by stays 135. An external bus bar unit 136 is arranged between the first heat sink 40 and the DC link capacitor unit 21.

Figure 16:
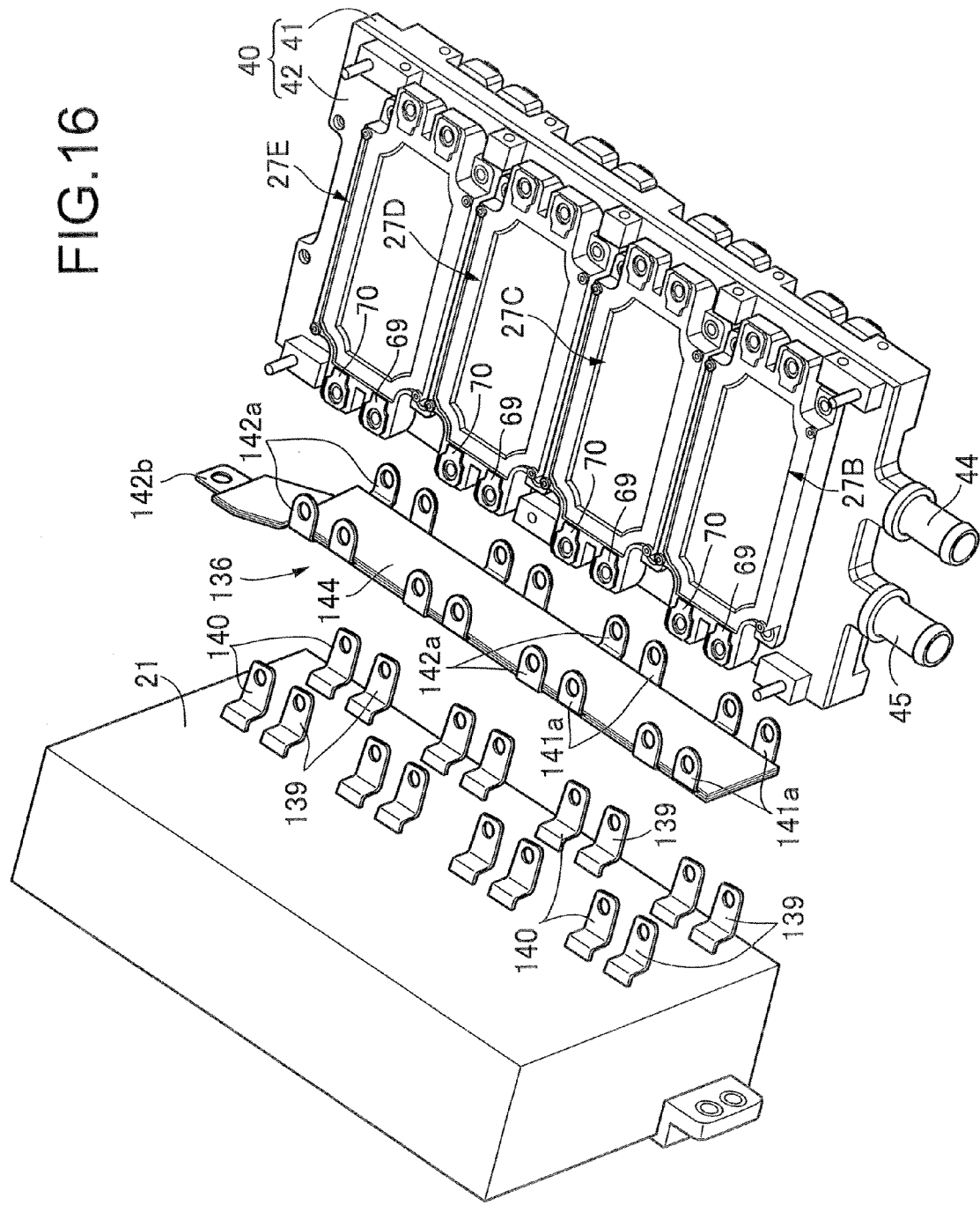
FIG. 16 is an exploded perspective view of the switching element assembly unit, a DC link capacitor unit, and an external bus bar unit.

In FIG. 16, from the lateral face of the DC link capacitor unit 21 which faces the first heat sink 40, positive side connection terminals 139 and negative side connection terminals 140 project. The positive and negative side connection terminals 139, 140 are to be connected to the positive side connection terminals 69 and the negative side connection terminals 70 provided on the first to eighth switching element modules 27A to 27H mounted on the upper and lower surface of the first heat sink 40.

Figure 17:
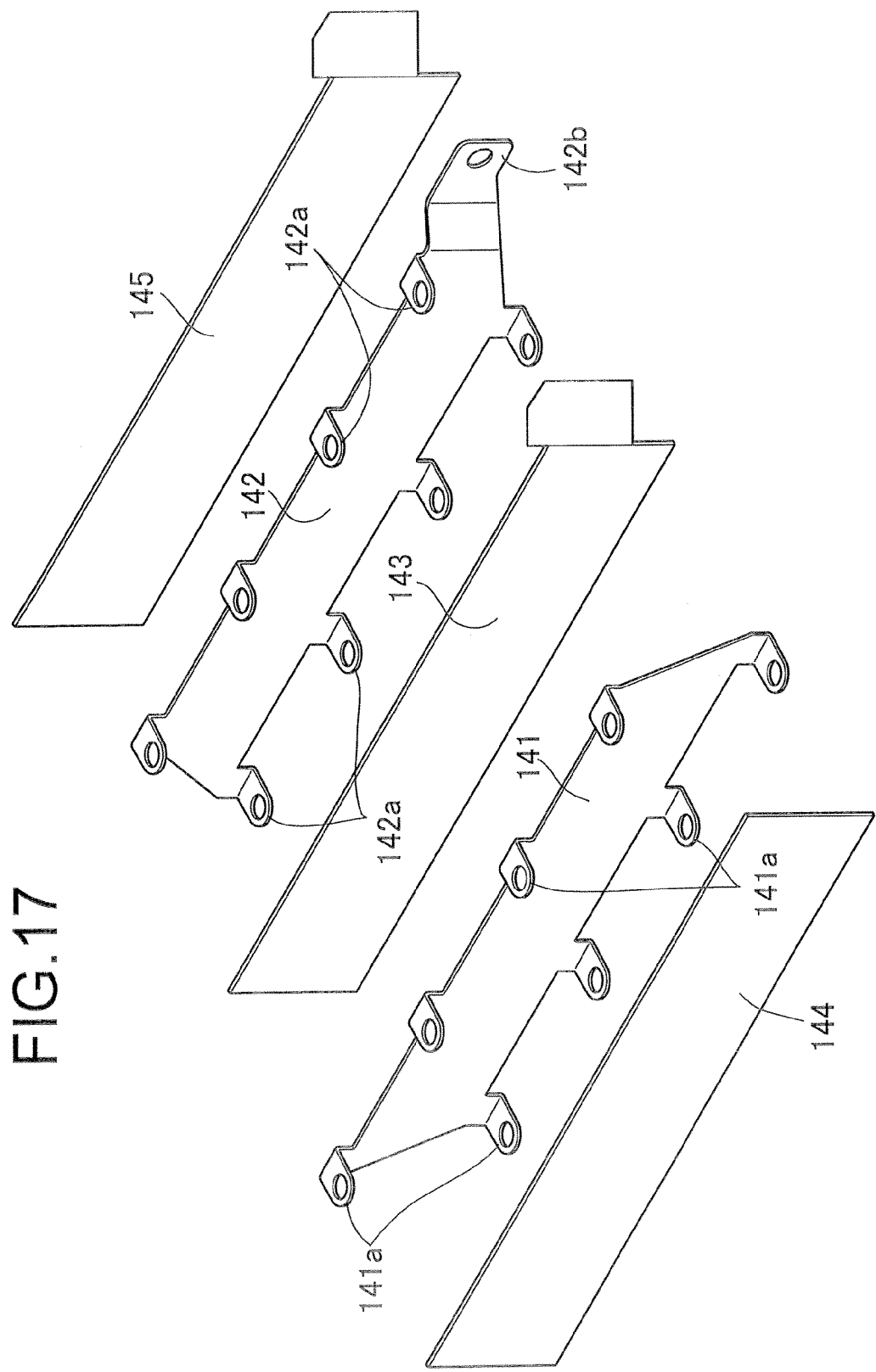
FIG. 17 is an exploded perspective view of the external bus bar unit.

In FIG. 17, the external bus bar unit 136 includes: a positive side external bus bar 141 having multiple positive side connection pieces 141a projecting from its both sides, the positive side connection pieces 141a connected to the positive side connection terminals 69 of the first to eighth switching element modules 27A to 27H and the positive side connection terminals 139 of the DC link capacitor unit 21; and a negative side external bus bar 142 having multiple negative side connection pieces 142a projecting from its both sides, the negative side connection pieces 142a connected to the negative side connection terminals 70 of the first to eighth switching element modules 27A to 27H, and the negative side connection terminals 140 of the DC link capacitor unit 21. The external bus bar unit 136, which is arranged outside the DC link capacitor unit 21, is configured by stacking the positive side and negative side external bus bars 141, 142, a plate-shaped insulating member 143 interposed between the positive side external bus bar 141 and the negative side external bus bar 142, and plate-shaped insulating members 144, 145 which interpose the positive side and negative side external bus bars 141, 142 between themselves and the plate-shaped insulating member 143, respectively.

One end of the negative side external bus bar 142 in the external bus bar unit 136 is integrally provided with a mounting plate portion 142b which projects more than one end of the positive side external bus bar 141. The mounting plate portion 142b is fixed to the first heat sink 40 with a bolt 146, and the external bus bar unit 136 is in direct contact with the first heat sink 40.

Figure 11:
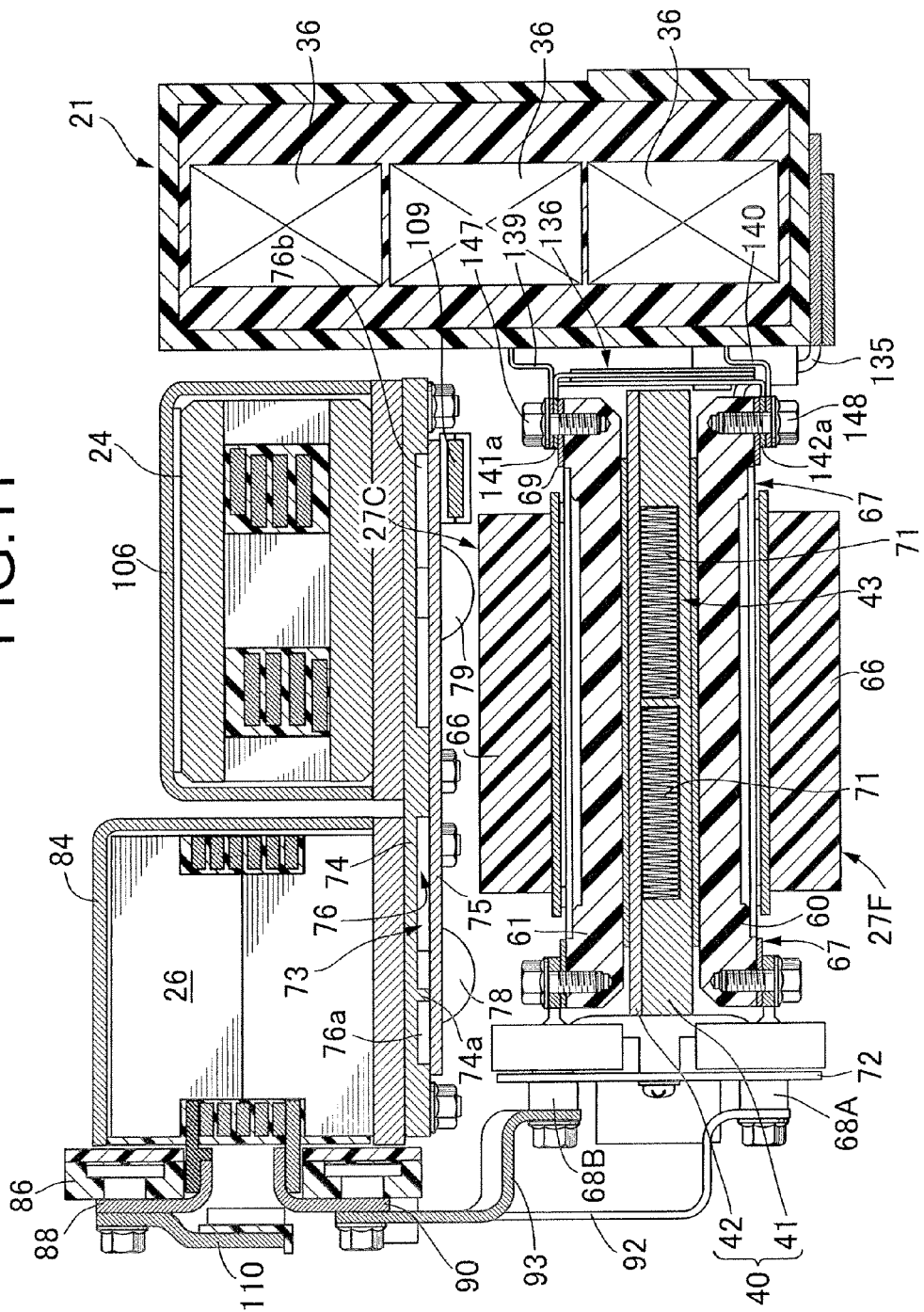
FIG. 11 is a cross-sectional view taken along a line 11-11 in FIG. 9.

Thus, as shown in FIG. 11, the positive side connection terminals 139 of the DC link capacitor unit 21, positive side connection pieces 141a of the external bus bar unit 136, and the positive side connection terminals 69 of the first to eighth switching element modules 27A to 27H are connected to each other by a bolt 147 with the positive side connection pieces 141a interposed between the positive side connection terminals 139 and the positive side connection terminals 69. Also, the negative side connection terminals 140 of the DC link capacitor unit 21, the negative side connection pieces 142a of the external bus bar unit 136, and the negative side connection terminals 70 of the first to eighth switching element modules 27A to 27H are connected to each other by a bolt 148 with the negative side connection pieces 142a interposed between the negative side connection terminals 140 and the negative side connection terminals 70.

Now, DC power obtained by the first converter 18 or the second converter 19 is converted by the inverter 20 into AC power, which is supplied to the electric motor 17. The power from the first converter 18 or the second converter 19 is once stored in the smoothing capacitor 36 of the DC link capacitor unit 21, and then the stored power is drawn by the inverter 20. Such flow of power can be represented by a flow of current. When the external bus bar unit 136 is not provided, as shown by narrow line arrows in FIG. 18A, a current i1 supplied from the smoothing capacitor 36, and a current i2 supplied from the first converter 18 or the second converter 19 without passing through the smoothing capacitor 36 flow through the internal wiring of the DC link capacitor unit 21 to flow into the inverter 20. If the internal wiring of the DC link capacitor unit 21 is designed to have the load of all currents as such, the internal wiring will generate heat or become larger in size. Thus, the heat generated at the wiring causes an adverse thermal effect on the smoothing capacitor 36.

Figure 18A:
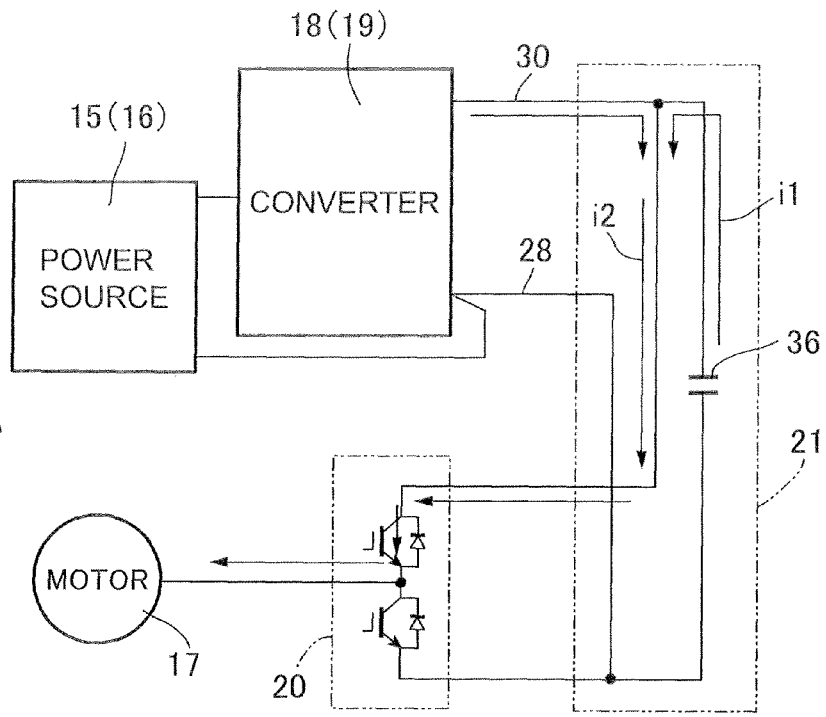
FIGS. 18A and 18B are simplified diagrams showing current paths between a converter and an inverter in two cases for comparison, FIG. 18A being a case without the external bus bar unit, and FIG. 18B being a case with the external bus bar unit.
Figure 18B:
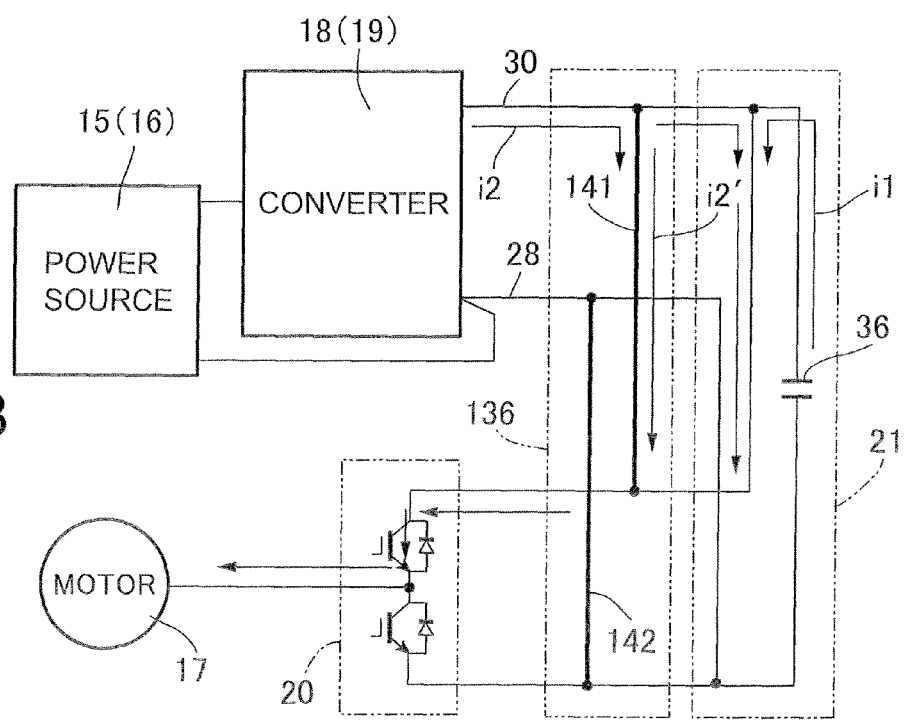

On the contrary, if the external bus bar unit 136 is interposed between the first converter 18 and the DC link capacitor unit 21 as well as the second converter 19 and the DC link capacitor unit 21, as shown by narrow line arrows in FIG. 18B, a portion i2' of the current i2 supplied from the first converter 18 or the second converter 19 directly flow into the inverter 20 side through the positive side external bus bar 141 in the external bus bar unit 136. Thus, the current flowing through the internal wiring of the DC link capacitor unit 21 can be suppressed to be low, and the thermal effect on the smoothing capacitor 36 can be suppressed to a lower level.

Figure 19:
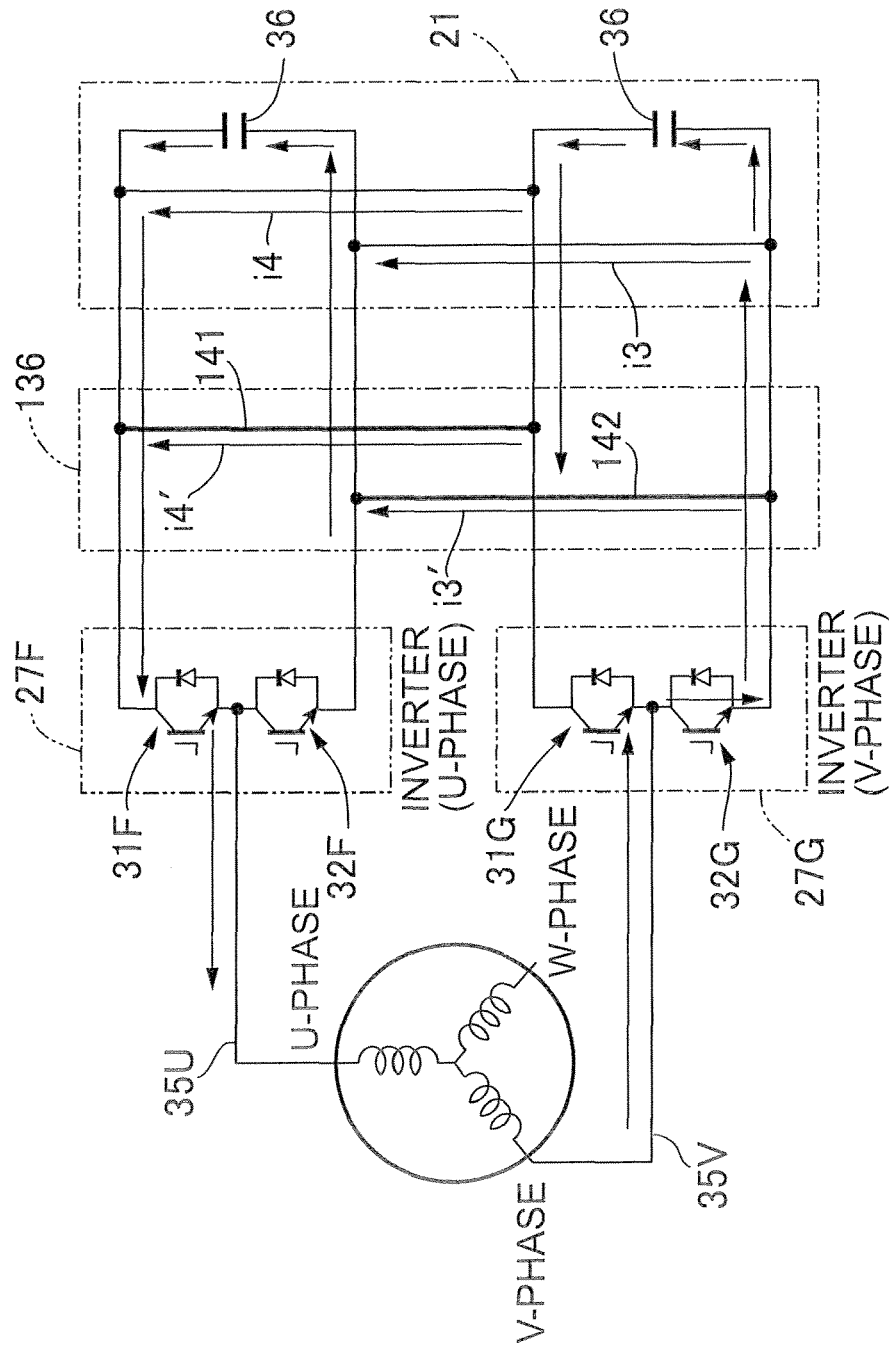
FIG. 19 is a simplified diagram showing an example of a path of commutation current in the DC link capacitor unit in the case with the external bus bar unit.
Figure 20:
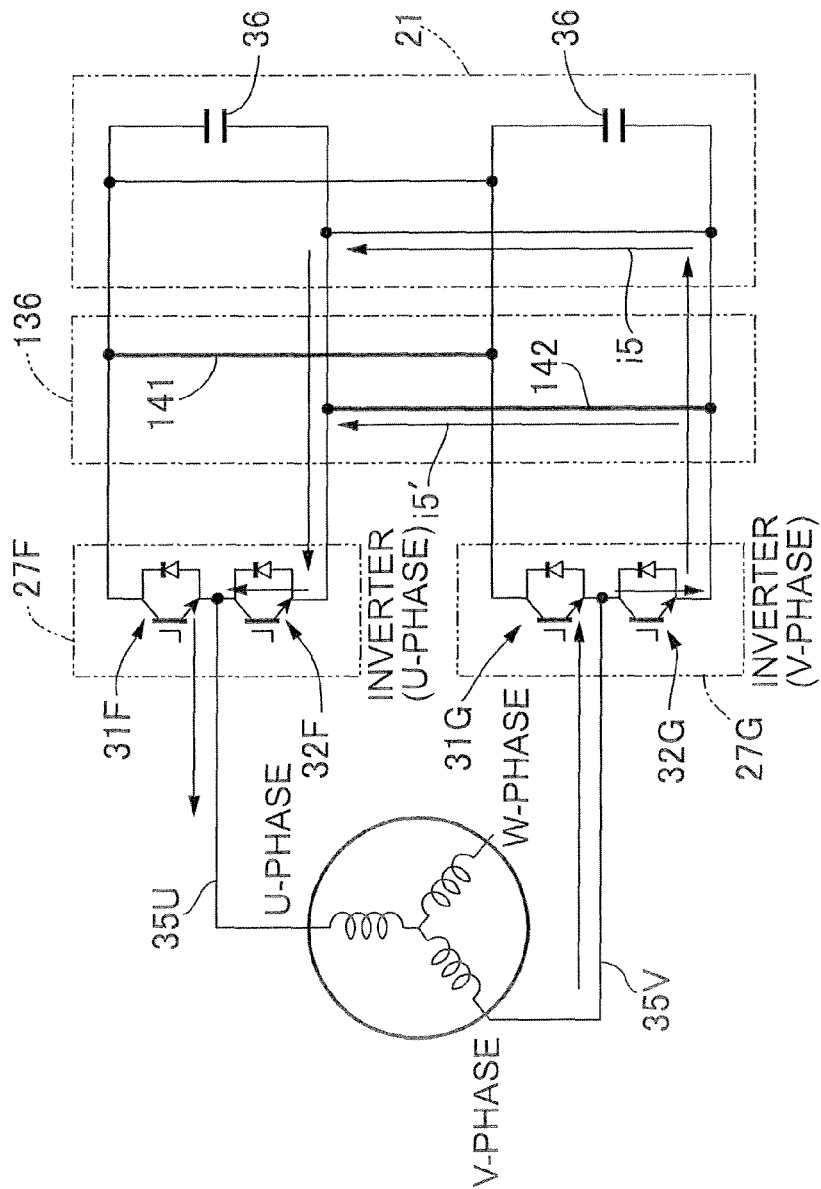
FIG. 20 is a simplified diagram showing another example of a path of commutation current in the DC link capacitor unit in the case with the external bus bar unit.
Figure 21:
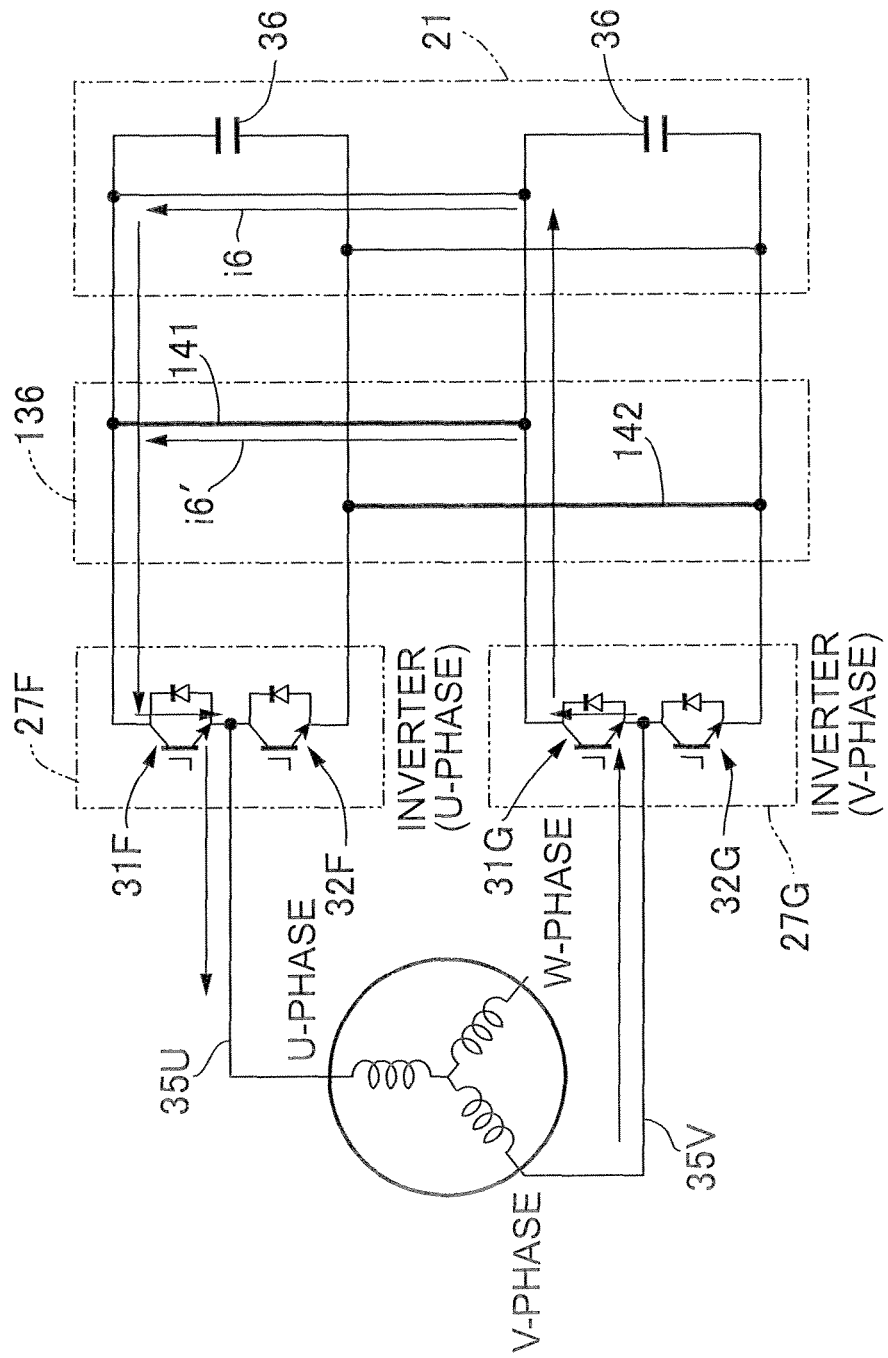
FIG. 21 is a simplified diagram showing yet another example of a path of commutation current in the DC link capacitor unit in the case with the external bus bar unit.

Also, commutation current flows into the DC link capacitor unit 21 by switching on/off of the sixth to eighth positive side switching elements 31F to 31H and the sixth to eighth negative side switching elements 32F to 32H of the sixth to eighth switching element modules 27F to 27H of the inverter 20. Referring to FIGS. 19 to 21, the path of the commutation current flowing inside the DC link capacitor unit 21 and the external bus bar unit 136 when the sixth and seventh positive side switching elements 31F, 31G, and the sixth and seventh negative side switching elements 32F, 32G are switched on/off is described. Here, for the sake of simplicity, a portion corresponding to W-phase of the inverter 20 is omitted.

First, when the sixth positive side switching element 31F and the seventh negative side switching element 32G are switched on, and the sixth negative side switching element 32F and the seventh positive side switching element 31G are switched off, as shown by narrow line arrows in FIG. 19, currents i3', i4' corresponding to currents i3, i4 flowing through the internal wiring of the DC link capacitor unit 21 flow through the positive side and negative side bus bars 141, 142 of the external bus bar unit 136. Thus, the current flowing through the internal wiring of the DC link capacitor unit 21 can be suppressed to be low.

Also when the sixth and seventh negative side switching elements 32F, 32G are switched on, and the sixth and seventh positive side switching elements 31F, 31G are switched off, as shown by narrow line arrows in FIG. 20, a current i5' corresponding to a current i5 flowing through the internal wiring of the DC link capacitor unit 21 flows through the negative side bus bar 142 of the external bus bar unit 136. Thus, the current flowing through the internal wiring of the DC link capacitor unit 21 can be suppressed to be low.

Further, when the sixth and seventh positive side switching elements 31F, 31G are switched on, and the sixth and seventh negative side switching elements 32F, 32G are switched off, as shown by narrow line arrows in FIG. 21, a current i6' corresponding to a current i6 flowing through the internal wiring of the DC link capacitor unit 21 flows through the positive side bus bar 141 of the external bus bar unit 136. Thus, the current flowing through the internal wiring of the DC link capacitor unit 21 can be suppressed to be low.

In other words, common connection of the positive side connection terminals 69 of the first to eighth switching element modules 27A to 27H to each other outside the DC link capacitor unit 21 by the external bus bar unit 136, and common connection of the negative side connection terminals 70 of the first to eighth switching element modules 27A to 27H to each other outside the DC link capacitor unit 21 by the external bus bar unit 136 allow a portion of the current supplied from the first converter 18 or the second converter 19 to the inverter 20 to flow outside the DC link capacitor unit 21, and allow a portion of the commutation current generated by switching on/off the sixth to eighth positive side switching elements 31F to 31H and the sixth to eighth negative side switching elements 32F to 32H in the inverter 20 to flow outside the DC link capacitor unit 21.

Next, an operation of the embodiment is described. The switching element assembly unit 67 is configured by including part of the first converter 18, the second converter 19 and the inverter 20 on the upper and lower surfaces of the water-cooled type first heat sink 40 with the first to eighth switching element modules 27A to 27H mounted on the upper and lower surfaces. Above the switching element assembly unit 67, the first inductor 24 and the three-phase transformer 26 in the first converter 18, and the second inductor 25 and the two-phase transformer 33 in the second converter 19 are arranged with the water-cooled type second heat sink 73 interposed between the switching element assembly unit 67 and the above components. Thus, the power conversion device can be made small in size while efficiently cooling the first to eighth switching element modules 27A to 27H, the first inductor 24, the three-phase transformer 26, the second inductor 25, and the two-phase transformer 33. In addition, the second heat sink 73 allows the first to eighth switching element modules 27A to 27H to be less effected by a noise due to the first inductor 24, the three-phase transformer 26, the second inductor 25, and the two-phase transformer 33.

Also, the capacitor unit 38 formed by integrating the first input capacitor 22 included in the first converter 18 and the second input capacitor 23 included in the second converter 19 is arranged above the switching element assembly unit 67 with the second heat sink 73 interposed between the switching element assembly unit 67 and the capacitor unit 38. Thus, compact arrangement of the first and second input capacitors 22, 23 allows the power conversion device to be compact, while heat transfer from the first to eighth switching element modules 27A to 27H to the first and second input capacitors 22, 23 is suppressed by the second heat sink 73.

Moreover, since the capacitor unit 38 has the single grounding terminal 120 common to the first and second input capacitors 22, 23, not only the capacitor unit 38 can be made more compact, but also its wiring inductance can be reduced.

The first to eighth switching element modules 27A to 27H, the number of which is even, are mounted on the upper and lower surfaces of the first heat sink 40 in a substantially symmetrical arrangement with respect to the first heat sink 40. Thus, cooling performance of the first to eighth switching element modules 27A to 27H can be optimized.

Also, the first to eighth switching element modules 27A to 27H are mounted on the first heat sink 40 with their connection terminals arranged in the same direction. The first to the fifth switching element modules 27A to 27E, which are part of the first and second converters 18, 19 and are mounted on the first heat sink 40, and the three-phase transformer 26 and the two-phase transformer 33, which are part of the first and second converters 18, 19 and are disposed on the second heat sink 73 while being directly coupled to the first to the fifth switching element modules 27A to 27E, are connected to each other by the bus bars 92, 93, 94, 100, and 101. Thus, the lengths of the bus bars 92 to 94, 100, 101 can be minimized, and also the assembly of the unit can be made easier.

Incidentally, the multiple stud bolts 63 each having threaded shank portions 63*a* at opposite ends thereof are implanted in the first heat sink 40 in such a manner that the threaded shank portions 63*a* project from the upper and lower surfaces of the first heat sink 40. The cases 60 and the copper base plates 58 of the first to eighth switching element modules 27A to 27H are secured by fastening the nuts 64 engaged with the threaded shank portions 63*a* of selected ones of stud bolts 63 out of all the stud bolts 63, and thereby the first to eighth switching element modules 27A to 27H are mounted on the upper and lower surfaces of the first heat sink 40. The first to eighth switching element modules 27A to 27H can be easily mounted on the upper and lower surfaces of the first heat sink 40 with fewer components.

The cooling water pump 80 which supplies cooling water to the first cooling water passage 43 in the first heat sink 40 and the second cooling water passage 76 in the second heat sink 73 is connected in parallel to the first and second cooling water passages 43, 76 to distribute and supply the cooling water from the cooling water pump 80 to the first and second heat sinks 40, 73. Thus, optimal cooling performance can be obtained for cooling the first to eighth switching element modules 27A to 27H, the first inductor 24, the three-phase transformer 26, the second inductor 25, and the two-phase transformer 33.

The first to eighth positive side switching elements 31A to 31H and the first to eighth negative side switching elements 32A to 32H included in the first to eighth switching element modules 27A to 27H each have multiple chips 47, 48, 49, 50, 51, and 52, which are arranged on the first heat sink 40 by twos side-by-side along the circulation direction 46 of the cooling water in the first cooling water passage 43. The set of the cooling fins 71 is separately arranged for each set of chips of 47, 49, 51 and each set of chips 48, 50, 52 aligned along the circulation direction 46 in the first cooling water passage 43 included in the first heat sink 40. Also, as clearly shown in FIG. 6, the sets of cooling fins 71 for the sets of chips of 47, 49, 51 are arranged to be offset from the sets of cooling fins 71 for the sets of chips 48, 50, 52 in a direction perpendicular to the circulation direction 46.

Thereby, thermal entrance regions as shown in FIG. 7B can be formed at the inlet of each set of the cooling fins 71 separately arranged for corresponding one of sets of chips 47, 49, 51 and sets of chips 48, 50, 52 aligned along the circulation direction 46. Accordingly, a high cooling efficiency across the entire first cooling water passage 43 can be obtained.

The first to eighth positive side switching elements 31A to 31H and the first to eighth negative side switching elements 32A to 32H included in the first to eighth switching element modules 27A to 27H are arranged at positions spaced apart along the circulation direction 46 in the first cooling water passage 43. In the present embodiment, the first to eighth positive side switching elements 31A to 31H are arranged at positions corresponding to the outward passage portion 43*a* in the first cooling water passage 43, whereas the first to eighth negative side switching elements 32A to 32H are arranged at positions corresponding to the return passage portion 43*b* in the first cooling water passage 43. Thus, a thermal entrance region is formed for each of the first to eighth positive side switching elements 31A to 31H and the first to eighth negative side switching elements 32A to 32H, and the cooling efficiency can be increased.

Also, the first to eighth switching element modules 27A to 27H are mounted on the first heat sink 40 in such a manner that the first to eighth positive side switching elements 31A to 31H and the first to eighth negative side switching elements 32A to 32H included in the first to eighth switching element modules 27A to 27H are sealed inside the coated layers 65 made of a synthetic resin. Thus, the first to eighth switching element modules 27A to 27H can be effectively cooled by the heat dissipation from the coated layers 65 and the cooling from the first heat sink 40.

Now, the DC link capacitor unit 21 having the smoothing capacitor 36 is provided between the first converter 18 and the inverter 20 as well as between the second converter 19 and the inverter 20, and the positive side connection terminals 69 and the negative side connection terminals 70 of the first to eighth switching element modules 27A to 27H included in the first converter 18, the second converter 19, and the inverter 20 are connected to the positive side connection terminals 139 and the negative side connection terminals 140 provided on the DC link capacitor unit 21. The positive side connection terminals 69, 139 are connected in common to the positive side external bus bar 141, and the negative side connection terminals 70, 140 are connected in common to the negative side external bus bar 142. Since the external bus bar unit 136 is integrally formed by stacking the positive side and negative side external bus bars 141, 142 arranged outside the DC link capacitor unit 21 with the insulating member 143 interposed therebetween, the current flowing through the internal wiring of the DC link capacitor unit 21 is decreased. Thus, the internal wiring of the DC link capacitor unit 21 can be prevented from generating heat which causes an adverse thermal effect on the smoothing capacitor 36.

Furthermore, since the external bus bar unit 136 is in direct contact with the first heat sink 40, the heat generated in the external bus bar unit 136 is directly transferred to the first heat sink 40 side. Thus, a temperature rise near the DC link capacitor unit 21 can be suppressed.

An embodiment of the present invention is explained above, but the present invention is not limited to the above-mentioned embodiment and may be modified in a variety of ways as long as the modifications do not depart from the gist of the present invention.

We claim:

1. A power conversion device comprising:
    a converter which includes a plurality of switching element modules and a plurality of magnetic parts, the converter steps up or down a voltage of a direct current power supply; and
    an inverter which includes a plurality of switching element modules other than the switching element modules of the converter and converts the direct current voltage obtained by the converter into an alternating voltage to drive an electric motor,
    wherein the plurality of magnetic parts are arranged above a switching element assembly unit with a water-cooled type second heat sink interposed between the switching element assembly unit and the plurality of magnetic parts, the switching element assembly unit configured by mounting all the switching element modules on upper and lower surfaces of a water-cooled type first heat sink.

2. The power conversion device according to claim 1, wherein
    a plurality of stud bolts each having threaded shank portions at opposite ends thereof are implanted in the first heat sink in such a manner that the threaded shank portions project from the upper and lower surfaces of the first heat sink, and
    the switching element modules are mounted on the upper and lower surfaces of the first heat sink in such a manner that the switching element modules are fastened to the threaded shank portions of selected stud bolts out of the stud bolts.

3. The power conversion device according to claim 1, wherein a cooling water supply source is connected in parallel to the first and second heat sinks in order to distribute and supply cooling water to the first and second heat sinks.

4. The power conversion device according to claim 1, wherein an even number of the switching element modules are mounted on the upper and lower surfaces of the first heat sink in a substantially symmetrical arrangement with respect to the first heat sink.

5. The power conversion device according to claim 1, wherein the plurality of switching element modules that constitute part of the converter and mounted on the upper and lower surfaces of the first heat sink, and magnetic parts that are directly coupled to the switching element modules constituting part of the converter out of all the magnetic parts, are connected to each other by bus bars.

6. The power conversion device according to claim 1, wherein the plurality of magnetic parts and a capacitor unit are disposed above the switching element assembly unit with the second heat sink interposed between the switching element assembly unit and the plurality of magnetic parts and between the switching element assembly unit and the capacitor unit, the capacitor unit formed by integrally including input capacitors respectively included in first and second converters which step up or down voltages of a pair of the direct current power supplies.

7. The power conversion device according to claim 6, wherein the capacitor unit includes a single grounding terminal common to the both input capacitors.

8. The power conversion device according to claim 1, wherein
    a DC link capacitor unit having a smoothing capacitor is provided between the converter and the inverter,
    positive side connection terminals of the plurality of switching element modules mounted on the upper and lower surfaces of the first heat sink are connected to positive side connection terminals provided on the DC link capacitor unit and are also connected in common to a positive side external bus bar,
    negative side connection terminals of the plurality of switching element modules mounted on the first heat sink are connected to negative side connection terminals provided on the DC link capacitor unit and are also connected in common to a negative side external bus bar, and
    the positive side and negative side external bus bars arranged outside the DC link capacitor unit are stacked with an insulating member interposed between the positive side and negative side external bus bars to be integrated into an external bus bar unit.

9. The power conversion device according to claim 8, wherein the external bus bar unit is in direct contact with the first heat sink.

* * * * *